United States Patent
Sekimoto et al.

(10) Patent No.: US 7,886,685 B2
(45) Date of Patent: Feb. 15, 2011

(54) SUBSTRATE HOLDING APPARATUS, SUBSTRATE HOLDING METHOD, AND SUBSTRATE PROCESSING APPARATUS

(75) Inventors: Masahiko Sekimoto, Tokyo (JP); Seiji Katsuoka, Tokyo (JP); Naoki Dai, Tokyo (JP); Teruyuki Watanabe, Tokyo (JP); Takahiro Ogawa, Tokyo (JP); Kenichi Suzuki, Tokyo (JP); Kenichi Kobayashi, Tokyo (JP); Yasuyuki Motoshima, Tokyo (JP); Ryo Kato, Tokyo (JP)

(73) Assignee: Ebara Corporation, Tokyo (JP)

( * ) Notice: Subject to any disclaimer, the term of this patent is extended or adjusted under 35 U.S.C. 154(b) by 1323 days.

(21) Appl. No.: 10/578,100

(22) PCT Filed: Dec. 22, 2004

(86) PCT No.: PCT/JP2004/019681

§ 371 (c)(1),
(2), (4) Date: May 3, 2006

(87) PCT Pub. No.: WO2005/064642

PCT Pub. Date: Jul. 14, 2005

(65) Prior Publication Data

US 2007/0070575 A1    Mar. 29, 2007

(30) Foreign Application Priority Data

Dec. 25, 2003   (JP) .............................. 2003-431346
Dec. 26, 2003   (JP) .............................. 2003-432480

(51) Int. Cl.
  *B05C 3/00*   (2006.01)

(52) U.S. Cl. .................. 118/400; 118/503; 118/731
(58) Field of Classification Search ................. 118/503, 118/731
See application file for complete search history.

(56) References Cited

U.S. PATENT DOCUMENTS

| 7,087,117 | B2 | 8/2006 | Katsuoka et al. |
| 2003/0221612 | A1* | 12/2003 | Dai et al. ..................... 118/72 |

FOREIGN PATENT DOCUMENTS

| WO | 02/058114 | 7/2002 |
| WO | 03/105200 | 12/2003 |

* cited by examiner

Primary Examiner—Parviz Hassanzadeh
Assistant Examiner—Albert Hilton
(74) Attorney, Agent, or Firm—Wenderoth, Lind & Ponack, L.L.P.

(57) ABSTRACT

A substrate holding apparatus can meet the request for a smaller-sized compact apparatus while ensuring a sufficient immersion depth of a substrate in a processing liquid. The substrate holding apparatus includes: a substrate holder for supporting a substrate (W) by bringing a peripheral portion of a surface of the substrate (W) into contact with a first sealing member; and a substrate pressing section for lowering relative to the substrate holder so as to press the substrate (W) held by the substrate holder downward, thereby bringing a first sealing member into pressure contact with the substrate (W). The substrate pressing section is provided with a second ring-shaped sealing member which makes pressure contact with an upper surface of a ring-shaped holding section of the substrate holder, thereby sealing the peripheral region of the substrate pressing section.

2 Claims, 16 Drawing Sheets

F I G. 3
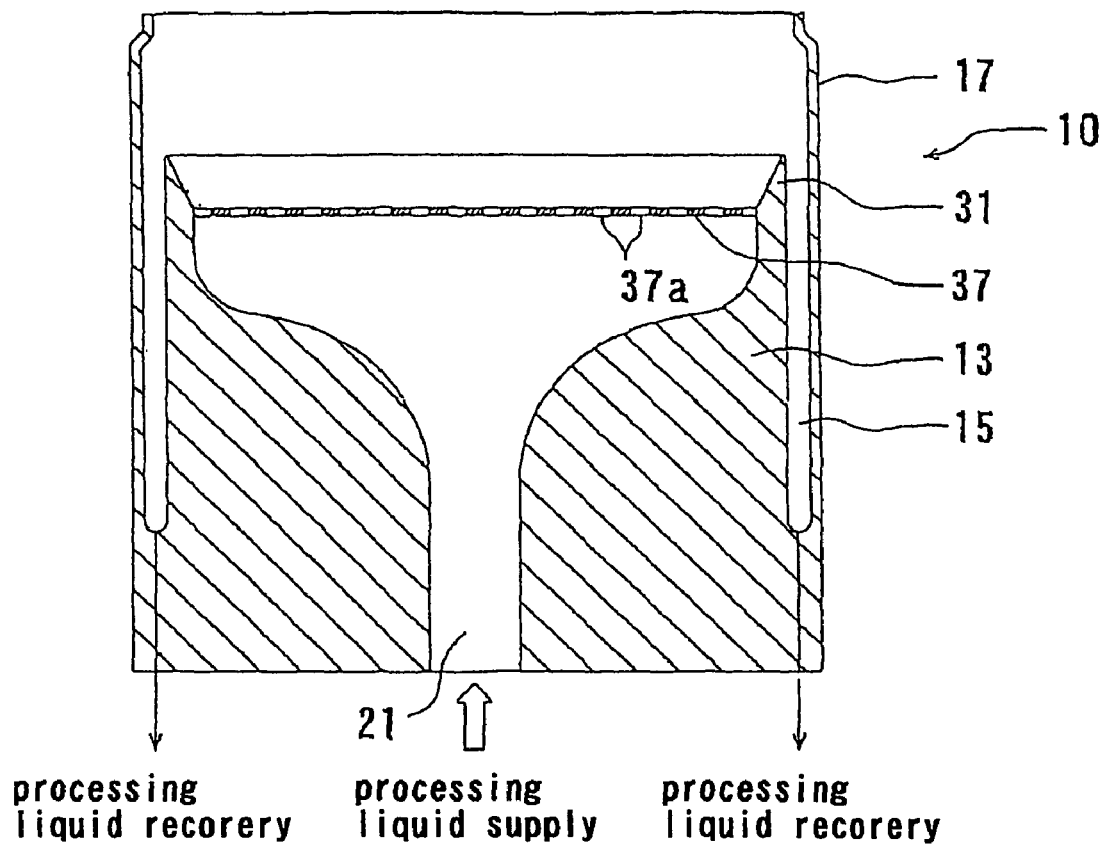
processing liquid recorery    processing liquid supply    processing liquid recorery

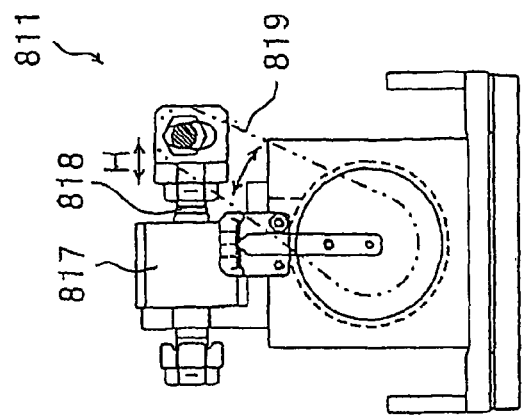
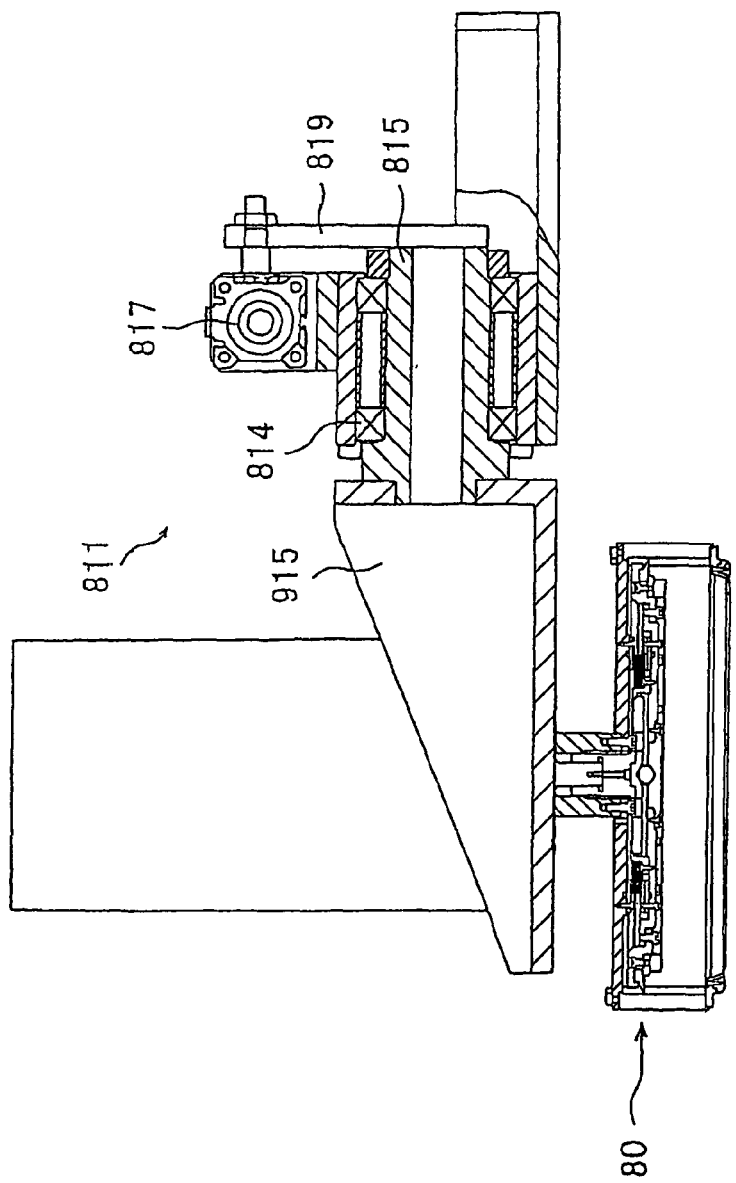
FIG. 4A
FIG. 4B

F I G. 6A
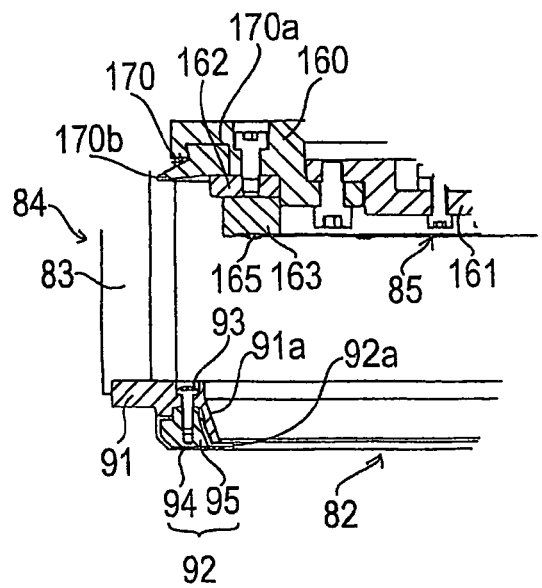
F I G. 6B
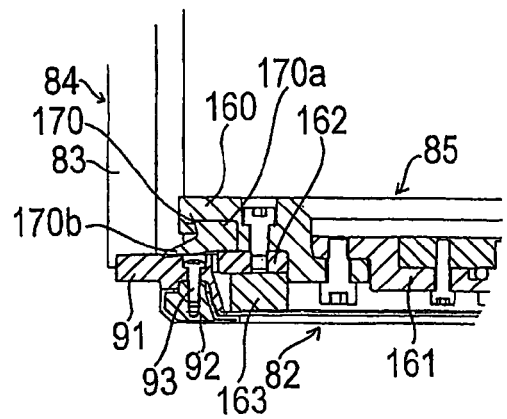
F I G. 7
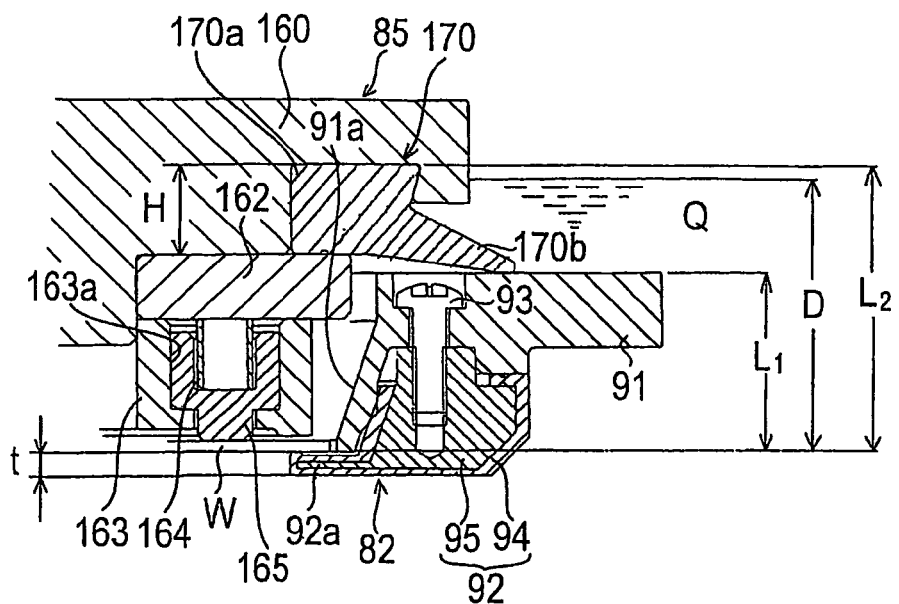

FIG. 8A
FIG. 8B
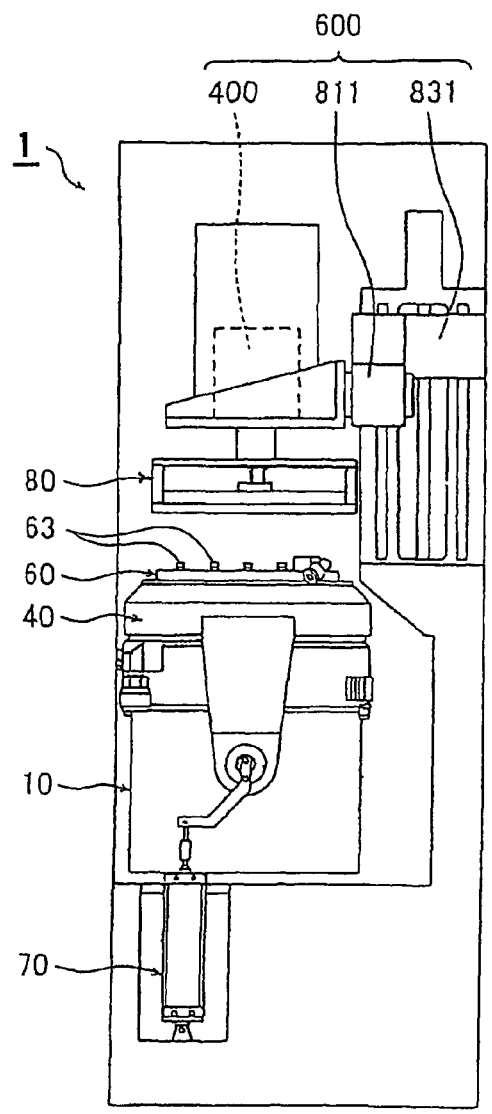
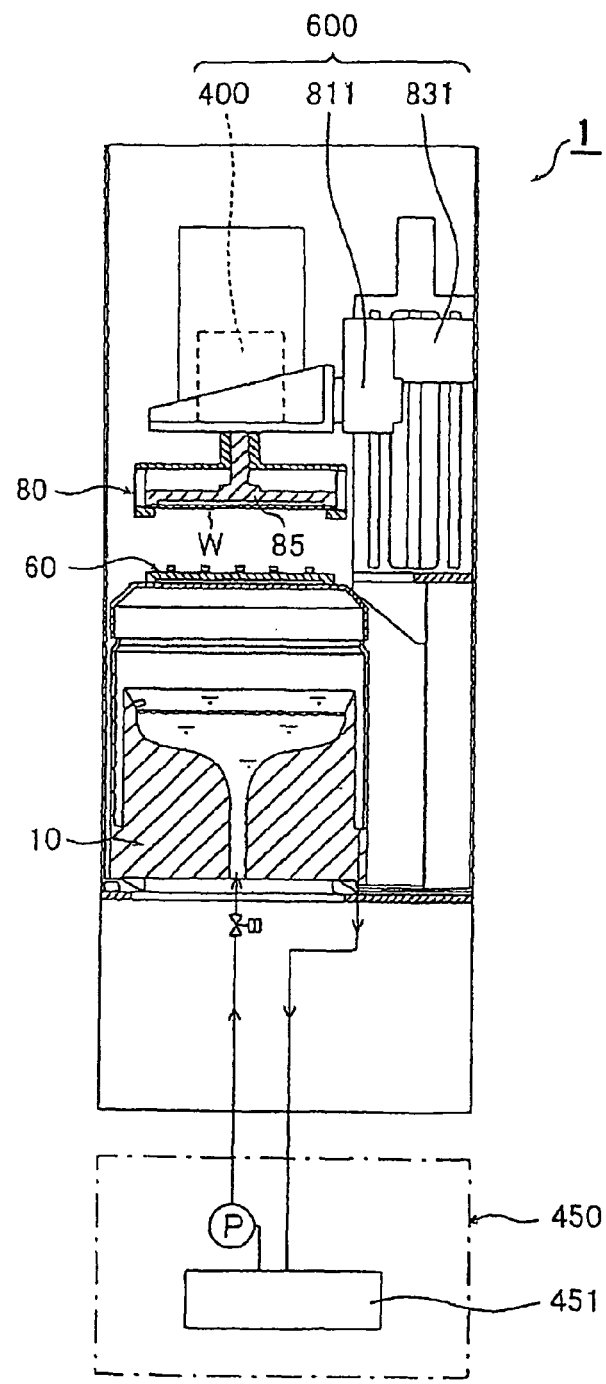

F I G. 1 4
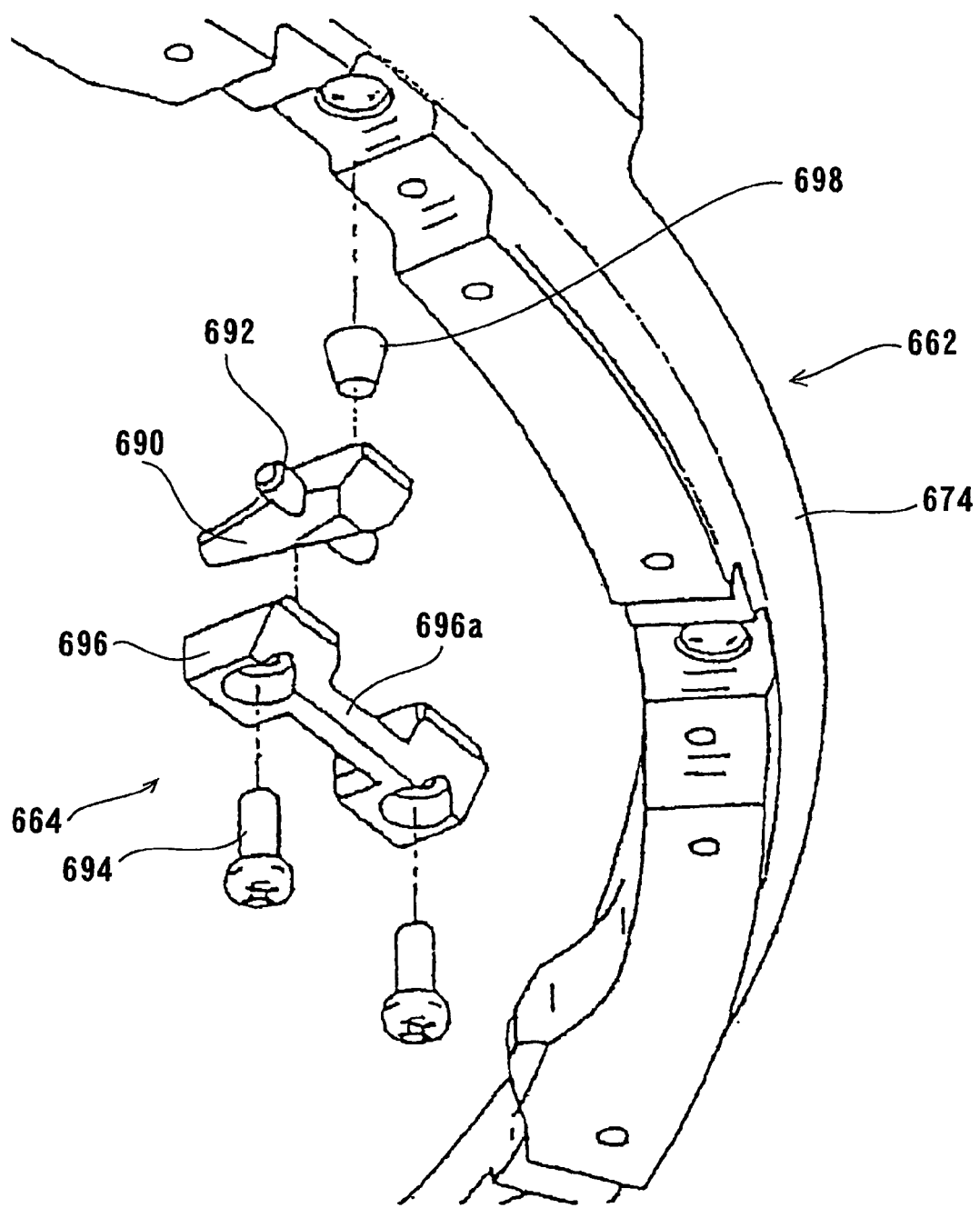

SUBSTRATE HOLDING APPARATUS, SUBSTRATE HOLDING METHOD, AND SUBSTRATE PROCESSING APPARATUS

TECHNICAL FIELD

The present invention relates to a substrate holding apparatus and a substrate holding method suitable for use in processing a surface (surface to be processed) of a substrate with a plating solution or other processing liquid, and a substrate processing apparatus incorporating the substrate holding apparatus.

BACKGROUND ART

As a process for forming interconnects in a semiconductor substrate, a so-called "damascene process", which comprises embedding a metal (electric conductor) into interconnect trenches and contact holes, is coming into practical use. According to this process, aluminum, or more recently a metal such as silver or copper, is embedded into interconnect trenches and contact holes previously formed in an interlevel dielectric layer. Thereafter, an extra metal is removed by performing chemical mechanical polishing (CMP) so as to flatten a surface of the substrate.

In a case of interconnects formed by such a process, for example, copper interconnects formed by using copper as an interconnect material, embedded interconnects of copper have exposed surfaces after the flattening processing. In order to prevent thermal diffusion of such interconnects (copper), or to prevent oxidation of such interconnects (copper) e.g. during forming thereon an insulating film (oxide film) under an oxidizing atmosphere to produce a semiconductor device having a multi-level interconnect structure, it is now under study to selectively cover the exposed surfaces of interconnects with an interconnects-protective layer (cap material) composed of a Co alloy, a Ni alloy or the like so as to prevent thermal diffusion and oxidation of the interconnects. Such an interconnects-protective layer of a Co alloy, a Ni alloy or the like can be produced e.g. by performing electroless plating.

As shown in FIG. 1, for example, fine recesses (interconnect trenches) 4 for interconnects are formed in an insulating film (interlevel dielectric layer) 2 of $SiO_2$ or the like which has been deposited on a surface of a substrate W such as a semiconductor wafer. A barrier layer 6 of TaN or the like is formed on a surface of the insulating film 2, and then copper plating, for example, is carried out onto the surface of the substrate W to fill the recesses 4 with copper and deposit copper film on the surface of the substrate W (damascene process). Thereafter, CMP (chemical mechanical polishing) is carried out onto the surface of the substrate W so as to flatten the surface of the substrate, thereby forming interconnects 8 composed of copper in the insulating film 2. Thereafter, an interconnects-protective layer (cap material) 9 composed of a CoWP alloy film is formed e.g. by electroless plating selectively on the surfaces of interconnects (copper) 8 to protect interconnects 8 (cap plating process).

A common electroless plating method for the selective formation of the interconnects-protective layer (cap material) 9 of the CoWP alloy film on the surfaces of interconnects 8 generally involves the following process steps: First, the substrate W such as a semiconductor wafer, which has undergone the CMP treatment, is immersed in an acid solution (first processing liquid) e.g. of 0.5M $H_2SO_4$ at the solution temperature of e.g. 25° C. for e.g. one minute to remove CMP residues, such as copper, remaining on a surface of an insulating film 2. The surface of the substrate W is then cleaned with a cleaning liquid (second processing liquid) such as ultrapure water (pre-cleaning process).

Next, the substrate W is immersed in a mixed solution (first processing liquid), e.g. of 0.005 g/L $PdCl_2$ and 0.2 ml/L HCl, at the solution temperature of e.g. 25° C. for e.g. one minute to adhere Pd as a catalyst to the surfaces of interconnects 8, thereby activating the exposed surfaces of interconnects 8. The surface of the substrate W is then cleaned with a cleaning liquid (second treatment liquid) such as ultrapure water (first pre-processing process).

Next, the substrate W is immersed in a solution (first processing liquid) containing e.g. 20 g/L of $Na_3C_6H_5O_7 \cdot 2H_2O$ (sodium citrate) at the solution temperature of e.g. 25° C., thereby carrying out neutralization treatment of the surfaces of interconnects 8. The surface of the substrate W is then cleaned with ultrapure water (second processing liquid) (second pre-processing process).

Next, the substrate W is immersed in a CoWP plating solution at the solution temperature of e.g. 80° C. for e.g. 120 seconds, thereby carrying out selective electroless plating (electroless CoWP cap plating) onto the activated surfaces of interconnects 8. Thereafter, the surface of the substrate W is cleaned with a cleaning liquid such as ultrapure water (plating process). The interconnects-protective layer 9 composed of a CoWP alloy film is thus formed selectively on the surfaces of interconnects 8 to protect interconnects 8.

A dip processing method, which involves immersing a substrate in a processing liquid to bring the surface (surface to be plated) of the substrate into contact with the processing liquid, has conventionally been employed for carrying out stable and uniform plating (e.g. electroless plating) of the substrate or stable and uniform pre-plating processing or cleaning of the substrate. A substrate processing apparatus adapted for the dip processing method is generally provided with a substrate holding apparatus for holding a substrate while sealing a peripheral portion of the front surface of the substrate, so that when the substrate, held by the substrate holding apparatus, is immersed in a processing liquid for processing of the substrate, the processing liquid is prevented from intruding into the peripheral portion of the front surface and also into the back surface of the substrate.

A substrate holding apparatus which employs a so-called vacuum attraction method has been developed. Such a substrate holding apparatus includes a ring-shaped attraction seal comprised of an elastic body such as a rubber, and presses the attraction seal against a substrate so as to bring the end surface of the attraction seal into tight contact with a peripheral portion of the back surface of the substrate over the entire circumference, and attracts and holds the substrate while sealing the peripheral portion of the back surface of the substrate in a ring with the attraction seal by internally vacuuming the attraction seal.

A substrate processing apparatus (plating apparatus) for carrying out various pre-processing steps, cleaning steps, etc. is requested to carry out various processings with good quality as a matter of course, and in addition, to be made compact or downsized and to increase the throughput.

It is, however, difficult to meet these requests especially with a substrate processing apparatus that employs the dip processing method. In particular, in order to ensure a sufficient immersion depth of a substrate, held by a substrate holding apparatus, in a processing liquid to improve the quality of processing, it is necessary, for example, to provide a weir or the like for closing off the flow of processing liquid on the substrate-fixing side, for example, on the side of a substrate holder for supporting the substrate, of the substrate holding apparatus so as to prevent the processing liquid from intruding into the back surface side of the substrate. This leads to an increased size not only of the substrate holding apparatus itself but also of a robot hand or the like for carrying a substrate in the substrate holding apparatus, and thus is incompatible with the request for a smaller-sized apparatus.

With respect to a substrate holding apparatus that employ the above-described vacuum attraction method, because of the dimensional tolerance of each member constituting the apparatus, variations between substrates, a biased pressure acting on an attraction seal comprised of an elastic body, etc., the end surface of the attraction seal cannot securely be contacted tightly, without an empty space, with a peripheral portion of the back surface of a substrate, which is held horizontally, over the entire circumference prior to vacuuming of the attraction seal. This could cause air leakage when attracting and holding a substrate by the substrate holding apparatus whereby the substrate cannot be attracted and held.

SUMMARY OF THE INVENTION

The present invention has been made in view of the above situation in the background art. It is therefore a first object of the present invention to provide a substrate holding apparatus, a substrate holding method, and a substrate processing apparatus which can meet the request for a smaller-sized compact apparatus while ensuring a sufficient immersion depth of a substrate in a processing liquid.

It is a second object of the present invention to provide a substrate holding apparatus, a substrate holding method and a substrate processing apparatus which can securely bring a peripheral portion of the back surface of a substrate into tight contact with the end surface of an attraction seal over the entire circumference of the attraction seal without creating an empty space therebetween, thereby securely attracting and holding the substrate.

In order to achieve the above objects, the present invention provides a substrate holding apparatus comprising: a substrate holder, provided with a first sealing member, for supporting a substrate by bringing a peripheral portion of a surface to be processed of the substrate into contact with the first sealing member; and a substrate pressing section for lowering relative to the substrate holder so as to press the substrate held by the substrate holder downward, thereby bringing the first sealing member into pressure contact with the substrate. The substrate pressing section is provided with a second ring-shaped sealing member which, when the substrate pressing section lowers relative to the substrate holder, makes pressure contact with an upper surface of a ring-shaped holding section of the substrate holder, thereby sealing the peripheral region of the substrate pressing section.

According to the substrate holding apparatus, the second ring-shaped sealing member is provided in the substrate pressing section and, upon holding of a substrate, the second sealing member is brought into pressure contact with the upper surface of the ring-shaped holding section of the substrate holder to seal the peripheral region of the substrate pressing section so that when immersing the substrate, held by the substrate holding apparatus, in a processing liquid to carry out processing of the substrate, the flow of the processing liquid can be closed off with the second sealing member, thereby preventing the processing liquid from intruding into the back surface side of the substrate. This makes it possible to ensure a sufficient immersion depth of the substrate, held by the substrate holding apparatus, in the processing liquid. Further, the provision of the second sealing member in the substrate pressing section, i.e. on the substrate pressing side of the apparatus, enables downsizing not only of the substrate holding apparatus itself but also of a robot hand for carrying a substrate in the substrate holding apparatus.

The second sealing member is preferably comprised of an elastic body.

The elastic body is, for example, a silicone rubber. The use of an elastic body, such as a silicone rubber, for the second sealing member can provide the second sealing member with a sufficient elasticity, thereby enhancing the sealing effect of the second sealing member with a low contact pressure.

The second sealing member preferably has a weir portion of a desired height.

The immersion depth of the substrate, held by the substrate holding apparatus, in a processing liquid can be adjusted by adjusting the height of the weir portion of the second sealing member. Thus, by making the weir portion higher, the immersion depth of the substrate, held by the substrate holding apparatus, in a processing liquid can be made deeper.

The first sealing member is preferably reinforced with a reinforcing material embedded therein.

By reinforcing the first sealing member with a reinforcing material to make the first sealing member have a sufficient strength, the height of that portion of the first sealing member which protrudes downwardly from a plane including the front surface of the substrate as held by the substrate holding apparatus can be made lower, thereby facilitating release of gas bubbles remaining on the front surface of the substrate.

In a preferred embodiment of the present invention, the substrate pressing section is provided with a plurality of pressing pins, each pin being exposed at the lower end and biased downwardly by an elastic body.

According to this embodiment, when holding a substrate by the substrate holding apparatus, the substrate is pressed downward by the pressing pins through the elastic forces of the elastic bodies. If bending occurs in the first sealing member, the degree of pressing (degree of contraction) can be adjusted by the pressing pins according to the degree of the bending, thereby preventing the formation of an empty space between the faces being sealed. Further, if the substrate is sticking to the substrate pressing section when detaching the substrate from the substrate pressing section after the completion of processing, the substrate can be securely detached from the substrate pressing section through the elastic forces of the elastic bodies.

In a preferred embodiment of the present invention, the substrate pressing section is provided with a flat cover plate having an air hole.

When a substrate is held by the substrate holding apparatus, the space formed between the cover plate of the substrate pressing section and the substrate can be prevented from becoming a hermetically sealed space by the provision of an air hole in the cover plate. Accordingly, even when a gas in the space expands or contracts due to immersion of the substrate in a processing liquid, etc., the substrate can be prevented from bending.

The present invention also provides a substrate holding method comprising: bringing a first ring-shaped sealing member, mounted to a substrate holder, into pressure contact with a peripheral portion of a substrate by a substrate processing section to seal the peripheral portion of the substrate; and at the same time bringing a second sealing member, mounted to the substrate pressing section, into pressure contact with the substrate holder to seal the peripheral region of the substrate pressing section, thereby holding the substrate.

The second sealing member preferably has a weir portion of a desired height.

The present invention also provides a substrate processing apparatus comprising: a substrate holding apparatus for holding a substrate; and a processing tank for bringing a surface to be processed of a substrate, held by the substrate holding apparatus, into contact with a processing liquid stored in the processing tank. The substrate holding apparatus comprises a substrate holder, provided with a first sealing member, for supporting the substrate by bringing the peripheral portion of the surface to be processed of the substrate into contact with the first sealing member, and a substrate pressing section for lowering relative to the substrate holder so as to press the substrate held by the substrate holder downward, thereby bringing the first sealing member into pressure contact with the substrate, wherein the substrate pressing section is provided with a second ring-shaped sealing member which, when the substrate pressing section lowers relative to the substrate holder, makes pressure contact with an upper surface of a ring-shaped holding section of the substrate holder, thereby sealing the peripheral region of the substrate pressing section.

The processing of the surface to be processed of the substrate with the processing liquid is, for example, a pre-plating processing.

The present invention also provides another substrate holding apparatus comprising: a substrate holding section for supporting a substrate with its front surface facing downward; and an attraction head provided with an attraction seal for attracting and holding the substrate supported by the substrate holding section while sealing a peripheral portion of the back surface of the substrate in a ring. The substrate holding section is provided with a plurality of pressing mechanisms, disposed at locations along the circumferential direction of the substrate holding section, for contacting a peripheral portion of the front surface of the substrate supported by the substrate holding section and pressing the substrate against the attraction head.

According to the substrate holding apparatus, the substrate supported by the substrate holding section is pressed against the attraction head independently at a plurality of portions along the circumferential direction of the substrate by the plurality of pressing mechanisms. This makes it possible to securely bring a peripheral portion of the back surface of the substrate into tight contact with the end surface of the attraction seal over the entire circumference of the attraction seal without creating an empty space therebetween, thereby securely attracting and holding the substrate.

Each pressing mechanism preferably includes a movable claw which, as the substrate holding section moves relatively and closer to the attraction head, comes into contact with a peripheral portion of the front surface of the substrate and presses the substrate against the attraction head.

By moving the substrate holding section relatively and closer to the attraction head, a peripheral portion of the back surface of a substrate can be securely brought into tight contact with the end surface of the attraction seal over the entire circumference of the attraction seal by the movable claws of the pressing mechanisms.

Preferably, the movable claw is supported vertically pivotably by a pivot shaft and disposed along the diametrical direction of the substrate holding section, biased downwardly by an elastic body on the outer side of the pivot shaft, and makes contact with a peripheral portion of the front surface of the substrate on the inner side of the pivot shaft.

Thus, as the substrate holding section moves relatively and closer to the attraction head, the substrate can be pressed upward against the attraction head by the movable claw on the inner side of the pivot shaft through the elastic force of the elastic body disposed on the outer side of the pivot shaft.

The elastic body is preferably comprised of a generally truncated conical rubber.

The present invention also provides still another substrate holding apparatus comprising: a substrate holding section for supporting a substrate with its front surface facing downward; and an attraction head provided with an attraction seal for attracting and holding the substrate supported by the substrate holding section while sealing a peripheral portion of the back surface of the substrate in a ring. The substrate holding section includes a base section, and a substrate support section for supporting the substrate, disposed at a given distance from the base section and tiltably coupled to the base section by a coupling section provided at a peripheral portion of the substrate support section.

According to the substrate holding apparatus, even when the back surface of the substrate supported by the substrate support section of the substrate holding section is inclined with respect to the end surface of the attraction seal, the substrate can be tilted upon contact of the back surface of the substrate with the end surface of the attraction seal to correct the inclination, thereby preventing one-sided contact. This makes it possible to securely bring a peripheral portion of the back surface of the substrate into tight contact with the end surface of the attraction seal over the entire circumference of the attraction seal without creating an empty space therebetween.

The coupling section preferably includes an elastic body for elastically coupling a member on the base section side and a member on the substrate support section side.

The elastic body is, for example, comprised of a helical spring.

The present invention also provides another substrate holding method comprising: supporting a substrate with its front surface facing downward; pressing the substrate against a ring-shaped attraction seal portion by a plurality of pressing mechanisms disposed at locations along the circumferential direction of the substrate, thereby bringing a peripheral portion of the back surface of the substrate into tight contact with the attraction seal portion; and vacuuming the attraction seal portion to hold the substrate.

The present invention also provides still another substrate holding method comprising: supporting a substrate with its front surface facing downward; moving the substrate to a ring-shaped attraction seal portion while tilting the substrate, thereby bringing a peripheral portion of the back surface of the substrate into tight contact with the attraction seal portion; and vacuuming the attraction seal portion to hold the substrate.

The present invention also provides another substrate processing apparatus comprising: a substrate holding apparatus for holding a substrate; and a processing tank for bringing a surface to be processed of a substrate, held by the substrate holding apparatus, into contact with a processing liquid stored in the processing tank. The substrate holding apparatus comprises a substrate holding section for supporting the substrate with its front surface facing downward, and an attraction head provided with an attraction seal for attracting and holding the substrate supported by the substrate holding section while sealing the peripheral portion of the back surface of the substrate in a ring. The substrate holding section is provided with a plurality of pressing mechanisms, disposed at locations along the circumferential direction of the substrate holding section, for contacting a peripheral portion of the front surface of the substrate supported by the substrate holding section and pressing the substrate against the attraction head.

The present invention also provides still another substrate processing apparatus comprising: a substrate holding apparatus for holding a substrate; and a processing tank for bringing a surface to be processed of a substrate, held by the substrate holding apparatus, into contact with a processing liquid stored in the processing tank. The substrate holding apparatus comprises a substrate holding section for supporting a substrate with its front surface facing downward, and an attraction head provided with an attraction seal for attracting and holding the substrate supported by the substrate holding section while sealing a peripheral portion of the back surface of the substrate in a ring. The substrate holding section includes a base section, and a substrate support section for supporting the substrate, disposed at a given distance from the base section and tiltably coupled to the base section by a coupling section provided at a peripheral portion of the substrate support section.

The processing of the surface to be processed of the substrate with the processing liquid is, for example, electroless plating.

BRIEF DESCRIPTION OF DRAWINGS

FIG. 3 is an enlarged sectional view of a processing tank;

FIG. 4A is a schematic side view showing a tilting mechanism (the substrate holding apparatus is also shown), and FIG. 4B is a right side view of FIG. 4A;

FIG. 6A is an enlarged view of the portion A of FIG. 5, and FIG. 6B is a view corresponding to FIG. 6A but showing the apparatus upon holding of a substrate;

FIG. 7 is an enlarged view of the main portion of FIG. 6B;

FIG. 8A is a side view showing the substrate processing apparatus upon cleaning of a processed surface of a substrate, and FIG. 8B is a schematic sectional side view showing the substrate processing apparatus upon cleaning of the processed surface of the substrate;

FIG. 14 is an exploded perspective view of a pressing mechanism of the substrate holding section;

DETAILED DESCRIPTION OF THE INVENTION

Preferred embodiments of the present invention will now be described in detail with reference to the drawings.

Figure 1:
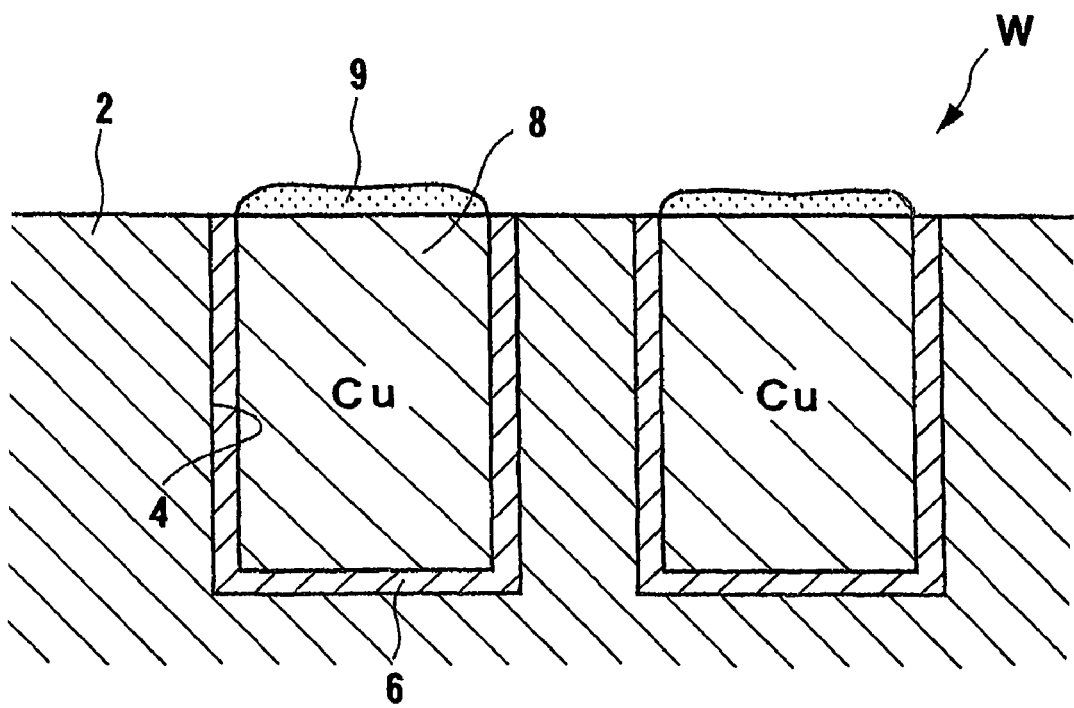
FIG. 1 is an enlarged sectional view of the main portion of a semiconductor substrate.
Figure 2:
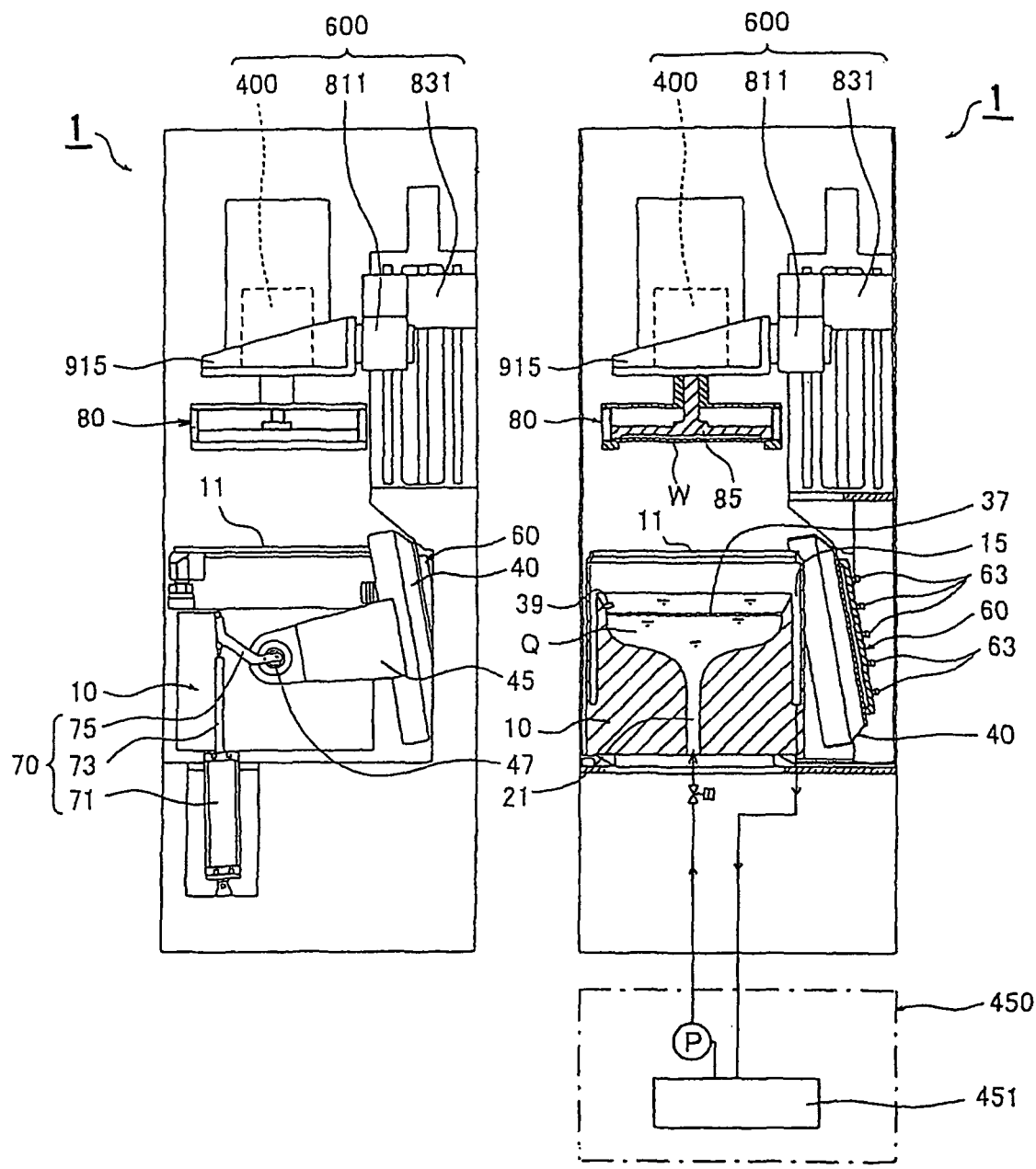
FIG. 2A is a side view of a substrate processing apparatus provided with a substrate holding apparatus according to an embodiment of the present invention.
FIG. 2B is a schematic sectional side view of the substrate processing apparatus.

FIG. 2A is a side view showing a substrate processing apparatus 1, for example, adapted to a first pre-processing apparatus for performing pre-processing of electroless plating, provided with a substrate holding apparatus 80 according to an embodiment of the present invention, and FIG. 2B is a schematic sectional side view of the substrate processing apparatus 1. As shown in FIGS. 2A and 2B, the substrate processing apparatus 1 comprises a processing tank 10 for holding a processing liquid (first processing liquid) Q therein and carrying out a dip processing of a substrate W, a cover 40 for closing the opening 11 of the processing tank 10, a spray nozzle 60 mounted to the upper surface of the cover 40, a drive mechanism 70 for driving (pivoting) the cover 40, a substrate holding apparatus 80 for holding the substrate W, a substrate holding apparatus drive section 600 for rotating, pivoting and vertically moving the whole substrate holding apparatus 80, and a processing liquid circulating device 450 for circulating the processing liquid Q in the processing tank 10.

FIG. 3 is an enlarged sectional view of the processing tank 10. As shown in FIG. 3, the processing tank 10 includes a vessel-shaped processing tank body 13 for holding the processing liquid Q, a recovery groove (overflow groove) 15 for recovering the processing liquid Q overflowing the top end portion 31 of the peripheral portion of the processing tank body 13, a cover portion 17 surrounding the recovery groove 15 and projecting upwardly and cylindrically, and a current plate 37 disposed within the processing tank body 13 for creating a uniform flow of the processing liquid Q within the processing tank body 13. A processing liquid supply inlet 21 is provided at the center of the bottom of the processing tank body 13. The current plate 37 is a circular flat plate which is provided with a large number of small through-holes 37a so that the processing liquid Q supplied from the plating solution supply inlet 21 can form a uniform upward flow whose current speed is equal at every point.

Referring again to FIGS. 2A and 2B, the processing liquid circulating device 450 returns the processing liquid Q, which has overflowed into the recovery groove 15 of the processing tank 10, through a pipe to a supply tank 451, and supplies the processing liquid Q which has been collected in the supply tank 451 to the plating solution supply inlet 21 of the processing tank body 13 by a pump P, thereby circulating the processing liquid Q. Thus, in the substrate processing apparatus 1, the processing liquid Q is circulated within the processing tank 10 by constantly supplying the processing liquid from the bottom of the processing tank 10, and the processing liquid Q which has overflowed is recovered in the recovery groove 15 provided around the processing tank body 13 and returned to the supply tank 451.

The cover 40 is comprised of a plate material of such a size as to close the opening 11 of the processing tank 10. Plate-like arms 45 are mounted to the opposite side surfaces of the cover 40, and are rotatably supported at portions near the respective ends by bearing portions 47 provided on the opposite sides of the processing tank 10. The ends of the arms 45 are fixed to the ends of coupling arms 75 of the drive mechanism 70.

The spray nozzle 60 is comprised of a plurality of nozzles 63 oriented upwardly and disposed on the upper surface of the cover 40. According to this embodiment, a cleaning liquid (pure water) is sprayed right upwardly from the nozzles 63.

The drive mechanism 70 comprises a cover pivoting cylinder 71, a rod 73 coupled to the piston of the cover pivoting cylinder 71, and the coupling arm 75 swingably coupled to the end of the rod 73. The lower end of the cover pivoting cylinder 71 is rotatably supported by a fixed member.

The substrate holding apparatus drive section 600 comprises a rotating motor 400 for rotationally driving the substrate holding apparatus 80, a tilting mechanism 811 for swinging the substrate holding apparatus 80, and a lifting mechanism 831 for raising and lowering the substrate holding apparatus 80.

FIG. 4A is a schematic side view showing the tilting mechanism 811 (the substrate holding apparatus 80 is also shown), and FIG. 4B is a right side view of FIG. 4A. As shown in FIGS. 4A and 4B, the tilting mechanism 811 includes a tilting shaft 815 fixed to a mounting base 915 and rotatably supported by a tilting shaft bearing 814 on the substrate-fixing side, a head tilting cylinder 817, and a link plate 819 pivotably mounted at one end to a side portion of a drive shaft 818 of the head tilting cylinder 817 and fixed at the other end to the tilting shaft 815. When the head tilting cylinder 817 is driven to move the drive shaft 818 in the direction of arrow H shown in FIG. 4B, the tilting shaft 815 rotates through a predetermined angle via the link plate 819 whereby the mounting base 915 and the substrate holding apparatus 80 swings as a unit. Thus, a substrate W held in the substrate holding apparatus 80 can be shifted between the horizontal position and a tilted position tilted at a predetermined angle relative to the horizontal position. The tilt angle of the substrate holding apparatus 80 can be adjusted arbitrarily by a mechanical stopper.

The lifting mechanism 831 shown in FIGS. 2A and 2B is a mechanism for moving the tilting mechanism 811 vertically. The substrate holding apparatus 80, the mounting base 915 mounting the rotating motor 400, etc., and the whole of the tilting mechanism 811 moves vertically by the actuation of the lifting mechanism 831. The vertical movement is controlled by the lifting mechanism 831. The tilting mechanism 811 and the lifting mechanism 831 allow a surface (surface to be processed) of a substrate W held in the substrate holding apparatus 80 to be dipped into the processing liquid Q while the substrate W is tilted relative to the liquid surface. The lifting mechanism 831 is so designed that it can adjust the region, to be in contact with the processing liquid, of the surface of a tilted substrate W within the range of, for example, 0-100%.

Figure 5:
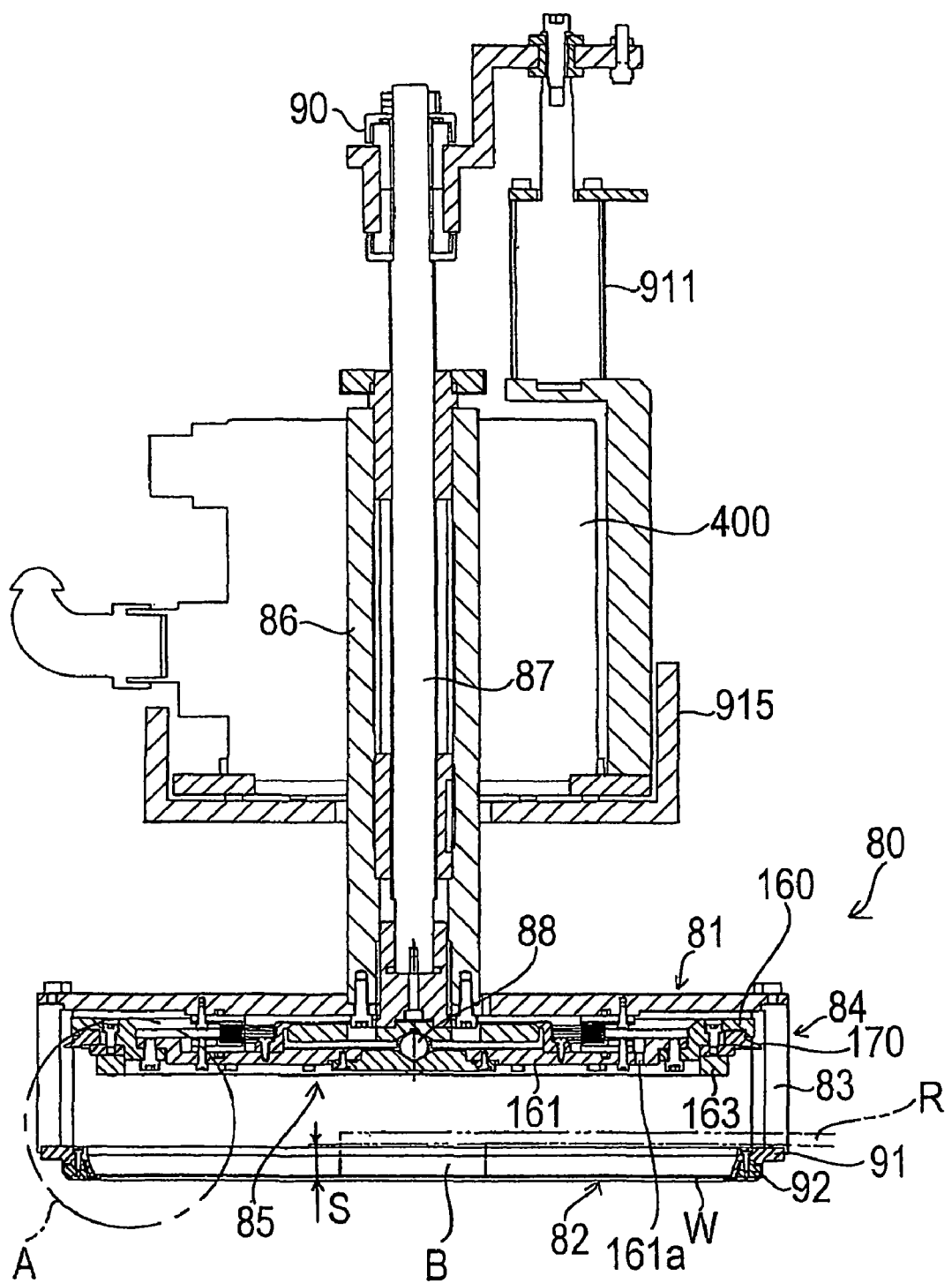
FIG. 5 is a schematic sectional side view showing the substrate holding apparatus and a rotating motor when a substrate pressing section is in a raised position.

FIG. 5 is a schematic sectional side view showing the substrate holding apparatus 80 and the rotating motor 400 immediately before holding a substrate. FIG. 6A is an enlarged view of the portion A of FIG. 5, and FIG. 6B is a view corresponding to FIG. 6A, but showing the state of the apparatus upon holding of a substrate. FIG. 7 is an enlarged view of the main portion of the apparatus of FIG. 6B.

As shown in FIG. 5, the substrate holding apparatus 80 includes a substrate holder 84 comprising a base section 81 and a holding section 82, which are disposed above and below at a given distance and coupled together by a pair of coupling plates 83 at their peripheral portions. A substrate pressing section 85 is disposed inside the substrate holder 84. The base section 81 of the substrate holder 84 is coupled to the hollow output shaft 86 of the rotating motor 400, for example, comprised of a servomotor. The substrate pressing section 85, at its center, is coupled via a ball bearing 88 to the lower end of a drive shaft 87 extending through the hollow portion of the output shaft 86. The upper end of the drive shaft 87 is rotatably supported by a bearing 90. The drive shaft 87 is rotatable together with the output shaft 86 and vertically movable independent of the output shaft 86 by means of a combination of the bearing and a spline engagement between the drive shaft 87 and the output shaft 86.

The holding section 82 of the substrate holder 84 includes a ring-shaped support 91 having in the inner circumferential surface a guide surface 91a for contacting the end surface of the substrate W to guide the substrate W. A first ring-shaped sealing member 92, projecting inwardly for contact with a peripheral portion of the front surface (surface to be processed) of the substrate W to support the substrate W, is mounted by bolts 93 to the lower surface of the support 91. The first sealing member 92 is comprised of an elastic body 94, such as a silicone rubber, reinforced with a reinforcing material 95 such as titanium embedded therein, and has a thin tabular sealing portion 92a reinforced with the reinforcing material 95 and projecting inwardly.

By thus reinforcing the first sealing member 92 with the reinforcing material 95 to make the first sealing member 92 have a sufficient strength, the height of that portion of the first sealing member 92 which protrudes downwardly from a plane including the front surface of the substrate W as held by the substrate holding apparatus 80, i.e. the thickness t of the sealing portion 92a, shown in FIG. 7, can be decreased to e.g. 1.5 mm (t=1.5 mm), thereby facilitating release of gas bubbles remaining on the front surface of the substrate W.

The substrate holder 84 has an outer diameter which is slightly smaller than the inner diameter of the top portion of the processing tank body 13 shown in FIG. 3 so that the substrate holder 84 almost covers the opening 11 of the processing tank body 13.

The substrate pressing section 85 includes a fixing ring 160 and a cover plate 161. A substrate pressing ring 163 is mounted, via an intermediate ring 162, to the lower surface of the fixing ring 160. A plurality of housing portions 163a are provided at predetermined locations along the circumferential direction of the substrate pressing ring 163, as shown in FIG. 7. In each housing portion 163a is housed a pressing pin 165 which is biased downwardly by an elastic body 164 such as a spring, exposed at its lower end, and is prevented from escaping downward by a step portion.

In operation, while supporting the substrate W by contacting its peripheral portion with the upper surface of the first sealing member 92, the substrate pressing section 85 is lowered so that the plurality of pressing pins 165 of the substrate pressing section 85 press the substrate W downward through the elastic forces of the elastic bodies 164, thereby bringing the first sealing member 92 into pressure contact with the peripheral portion of the substrate W to seal the peripheral portion with the first sealing member 92 and hold the substrate W. The substrate W is thus pressed downward by the pressing pins 165 through the elastic forces of the elastic bodies 164. Accordingly, if bending occurs in the first sealing member 92, the degree of pressing (degree of contraction) by the pressing pins 165 can be adjusted with the elastic bodies 164 according to the degree of the bending, thereby preventing the formation of an empty space between the faces being sealed. Further, if the substrate W is sticking to the substrate pressing ring 163 when detaching the substrate W from the substrate pressing ring 163 after the completion of processing, the substrate W can be securely detached from the substrate pressing ring 163 through the elastic forces of the elastic bodies 164.

As shown in FIG. 5, the cover plate 161 is comprised of a flat plate having a plurality of air holes 161a. When the substrate W is held by the substrate holding apparatus 80, the space formed between the cover plate 161 of the substrate pressing section 85 and the substrate W can be prevented from becoming a hermetically sealed space by the provision of air holes 161a in the cover plate 161. Accordingly, even when a gas in the space expands or contracts due to immersion of the substrate W in a processing liquid Q, etc., the substrate W can be prevented from bending.

A second ring-shaped sealing member 170 is fixed between the fixing ring 160 and the intermediate ring 162. The second sealing member 170 comprises a weir portion 170a having a rectangular cross section, and a sealing portion 170b coupled integrally to the outer circumferential surface of the weir portion 170a, the sealing portion 170b extending outside the fixing ring 160, tapering outward and inclined downward outwardly. When the substrate pressing section 85 is lowered to hold the substrate W between the substrate pressing section 85 and the substrate holder 84, the sealing portion 170b of the second sealing member 170 comes into pressure contact with the upper surface of the support 91 of the holding section 82 of the substrate holder 84, thereby sealing the peripheral region of the substrate pressing section 85.

Thus, according to this embodiment, the second sealing member 170 is provided in the substrate pressing section 85 and, upon holding of a substrate, the second sealing member 170 is brought into pressure contact with the upper surface of the holding section 82 of the substrate holder 84 to seal the peripheral region of the substrate pressing section 85. Accordingly, when immersing the substrate W, held by the substrate holding apparatus 80, in a processing liquid Q to carry out processing of the substrate, the flow of the processing liquid Q can be closed off with the second sealing member 170, thereby preventing the processing liquid Q from intruding into the back surface side of the substrate w, as shown in FIG. 7. This makes it possible to ensure a sufficient immersion depth D of the substrate W, held by the substrate holding apparatus 80, in the processing liquid Q. In this regard, if the second sealing member 170 is not provided, the immersion depth D of the substrate W in the processing liquid Q must be less than the distance $L_1$ ($D<L_1$) between the substrate W and the upper surface of the holding section 82 of the substrate holder 84. According to this embodiment, on the other hand, the immersion depth D of the substrate W can be made more than the distance $L_1$ between the substrate W and the upper surface of the holding section 82 of the substrate holder 84 and less than the distance $L_2$ [$D<L_2$ ($>L_1$)] between the substrate W and the upper surface of the second sealing member 170.

Further, the provision of the second sealing member 170 in the substrate pressing section 85, i.e. on the substrate pressing side of the apparatus, enables downsizing not only of the substrate holding apparatus 80 itself but also of a robot hand R (see FIG. 5) for carrying the substrate W in the substrate holding apparatus 80. In this regard, in order to ensure such an immersion depth D of the substrate W as described above, it is conceivable to provide a weir or the like, having a height matching the height of the second sealing member 170, in the holding section 82 of the substrate holder 84 integrally or water-tightly. The provision of such a weir or the like in the holding section 82 of the substrate holder 84, however, leads to an increased size of the substrate holder 84 and thus of the substrate holding apparatus 80. Furthermore, with respect to the robot hand R shown in FIG. 5 which attracts and holds the back surface of the substrate W by an attraction portion B and carries the substrate W in the substrate holding apparatus 80, it is necessary to use the robot hand R with the attraction portion B having a height S matching the height of the weir or the like, thus leading to an increased size of the robot hand R. The substrate holding apparatus of this embodiment can obviate such drawbacks.

The second sealing member 170 is comprised of an elastic body, for example, a silicone rubber. The use of an elastic body, such as a silicone rubber, for the second sealing member 170 can provide the second sealing member 170 with a sufficient elasticity, thereby enhancing the sealing effect with a low contact pressure.

The height H of the weir portion 170a of the second sealing member 170 may be set arbitrarily. The immersion depth D of the substrate W, held by the substrate holding apparatus 80, in a processing liquid Q can be adjusted by adjusting the height H of the weir portion 170a. Thus, by making the weir portion 170a higher, the immersion depth D of the substrate, held by the substrate holding apparatus 80, in a processing liquid Q can be made deeper.

The bearing 90 is coupled to a lifting mechanism 911, comprised of a cylinder, for moving up and down the bearing 90, and the lifting mechanism 911 is fixed on a member which is mounted on a mounting base 915 mounting the rotating motor 400, etc. The substrate pressing section 85 moves vertically, independent of the substrate holder 84, etc., by the actuation of the lifting mechanism 911. The substrate holder 84 is rotationally driven by the rotating motor 400.

The operation of the substrate processing apparatus 1 will now be described.

First, the substrate holding apparatus 80 is set at a position above the processing tank 10, as shown in FIGS. 2A and 2B, and the substrate pressing section 85 is set at a raised portion within the substrate holding apparatus 80, as shown in FIG. 5. A substrate W, which is held face down by the vacuum hand R of the robot (see FIG. 5), is inserted into the substrate holder 84 and the vacuum attraction of the vacuum hand R is released, thereby placing the substrate W on the first ring-shaped sealing member 92 having a diameter smaller by several mm than the diameter of the substrate W. The vertical drive mechanism 911 is then driven to lower the substrate pressing section 85 so that, as shown in FIGS. 6B and 7, the pressing pins 165 are pressed against a peripheral region of the upper surface of the substrate W whereby a peripheral region of the lower surface (surface to be processed) of the substrate W is pressed against the first sealing member 92, thereby fixing the substrate W. The first sealing member 92 is brought into pressure contact with the peripheral region of the substrate W to seal the peripheral region of the substrate W, and the second sealing member 170 is brought into pressure contact with the upper surface of the holding section 82 of the substrate holder 84 to seal the peripheral region of the substrate pressing section 85.

In the processing tank 10, on the other hand, the pump P shown in FIG. 2B is driven so that the processing liquid Q is supplied from the processing liquid inlet 21 and circulated within the processing tank 10, and is allowed to overflow the top end portion 31 of the processing tank 10, recovered in the recovery groove 15 and returned to the supply tank 451.

Next, the head tilting cylinder 817 shown in FIGS. 4A and 4B is driven to swing the mounting base 915 together with the substrate holding apparatus 80 to tilt the substrate W held in the substrate holding apparatus 80 at a predetermined angle relative to the horizontal position, for example, by 3 degrees, and the apparatus rotating motor 400 shown in FIG. 5 is then driven to rotate the substrate holding apparatus 80 together with the substrate W. By driving the lifting mechanism 831 shown in FIGS. 2A and 2B, the tilted substrate holding apparatus 80 is lowered to dip the substrate W into the processing liquid Q in the processing tank 10. At this time, not the whole, but part of the substrate W, for example, not less than 50%, preferably not less than 60% of the total area of the substrate W, is dipped into the processing liquid Q. The substrate W is rotating while it is dipped into the processing liquid Q. When thus carrying out processing of the substrate W by dipping only part of the substrate W, which is in the tilted position, in the processing liquid Q while rotating the substrate W, a point in the lower surface to be plated of the substrate W comes into contact with the liquid and then releases the liquid repeatedly. The surface to be processed is tilted when the substrate W is dipped in the processing liquid, whereby gas bubbles on the surface to be processed of the substrate W are discharged spontaneously from the deeper side toward the shallower side.

After thus carrying out the first pre-plating processing for a predetermined time by bringing the processing liquid Q into contact with the surface (surface to be processed) of the substrate W, the lifting mechanism 831 is driven to raise the substrate holding apparatus 80 to the position shown in FIGS. 2A and 2B, thereby terminating the first processing, while the tilting mechanism 811 is driven to return the substrate holding apparatus 80 to the horizontal position. Thereafter, the drive mechanism 70 is driven to pivot the cover 40 so as to close the opening 11 of the processing tank 10, as shown in FIGS. 8A and 8B. Next, a cleaning liquid (pure water) is sprayed right upwardly from the nozzles 63 of the spray nozzle 60 fixed on the upper surface of the cover 40 to clean the processed surface of the substrate W. Since the opening 11 of the processing tank 10 is covered with the cover 40, the cleaning liquid does not enter the processing tank 10, and therefore the processing liquid Q in the processing tank 10 is not diluted, enabling use of the processing liquid Q during circulating. The cleaning liquid after the cleaning of substrate W is discharged from a not-shown discharge outlet.

After completion of the cleaning of substrate W, the substrate pressing section 85 rises as shown in FIG. 5. The vacuum hand R of the robot is inserted into the substrate holder 84, attracts the center portion of the back surface of the substrate W by the attraction portion B, and takes the processed substrate W out. A next unprocessed substrate W is set in the substrate holding apparatus 80, which substrate is subjected to the above-described first pre-processing and cleaning steps.

Though in this embodiment the first pre-processing is carried out with the first processing liquid as the processing liquid Q held in the processing tank 10, it is also possible to carry out a second pre-processing of a substrate W with a second processing liquid held in the processing tank 10. Further, it is possible to use the substrate processing apparatus 1, not as a pre-plating processing apparatus, but as a substrate processing apparatus, such as an electroless plating apparatus, for carrying out other chemical processing. Further, processing of a substrate W by the spray nozzle 60 is not limited to the cleaning processing with a cleaning liquid, but applicable to other chemical processings. Furthermore, application of the present invention is not limited to the substrate processing apparatus 1 of the above-described construction. For example, the present invention is applicable to a substrate processing apparatus having such a construction that processing with a pre-processing liquid and cleaning are carried out, not in the upper and lower positions as in this embodiment, but at separate sites.

Figure 9:
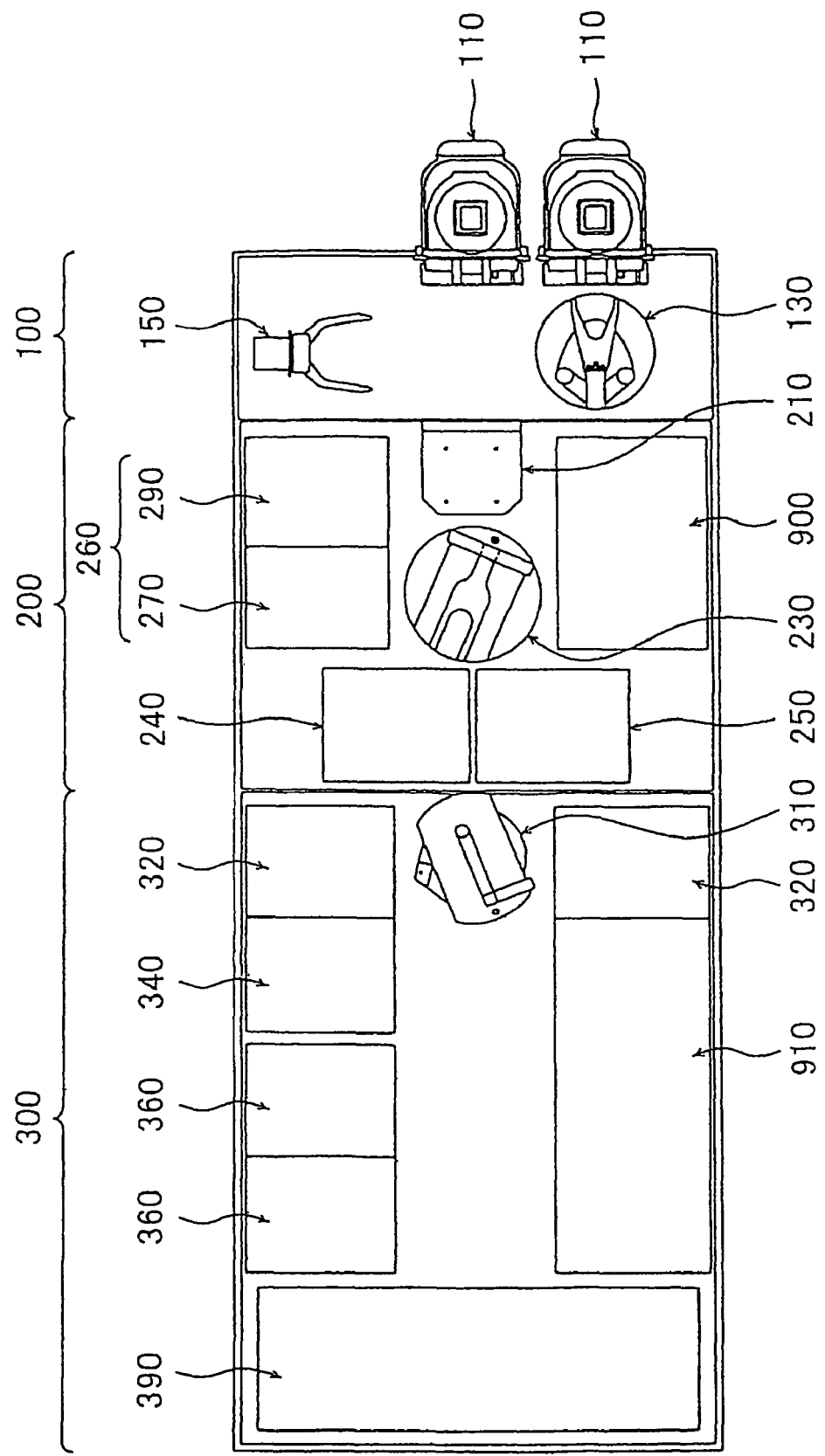
FIG. 9 is a plan view of a substrate processing system incorporating the substrate processing apparatus.

FIG. 9 is a plan view of a substrate processing system (electroless plating apparatus) incorporating the substrate processing apparatus 1 according to the above-described embodiment. As shown in FIG. 9, the substrate processing system comprises three processing areas: a loading/unloading area 100, a cleaning area 200, and a plating area 300. In the loading/unloading area 100, two loading ports 110, a first substrate transfer robot 130 and a first reversing machine 150 are installed. In the cleaning area 200, a temporary substrate storage stage 210, a second substrate transfer robot 230, a pre-cleaning unit 240, a second reversing machine 250, a cleaning unit 260 and a first chemical liquid supply unit 900 are installed. In the plating area 300, a third substrate transfer robot 310, first pre-processing units 320, a second pre-processing unit 340, two plating units 360, a plating solution supply unit 390 and a second chemical liquid supply unit 910 are installed. These chemical liquid supply units 900, 910 are units for diluting chemical liquids (undiluted liquids) to operating concentrations and supplying the diluted chemical liquids to the various units. The first chemical liquid supply unit 900 supplies chemical liquids for use in the pre-cleaning unit 240 and the cleaning unit 260 in the cleaning area 200, while the second chemical supply unit 910 supplies chemical liquids for use in the first pre-processing units 320 and the second pre-processing unit 340 in the plating area 300.

The substrate processing apparatus 1 of the above-described embodiment is employed for each first pre-processing unit 320. The substrate processing apparatus 1 of the above-described embodiment can be employed also for the second pre-processing unit 340 by using a second pre-processing liquid as the processing liquid to be supplied into the processing tank 10. Further, the substrate processing apparatus 1 of the above-described embodiment can be employed also for the plating unit 360 by using a plating solution as the processing liquid to be supplied into the processing tank 10.

The overall operation of the substrate processing system will now be described.

First, a substrate W is taken by the first substrate transfer robot 130 out of a substrate cassette mounted in the loading port 110. The substrate W is transferred to the first reversing machine 150 and reversed so that the surface to be plated faces downward, and is then transferred by the first transfer robot 130 to the temporary substrate storage stage 210 and placed on the stage 210. Next, the substrate W is transferred by the second substrate transfer robot 230 to the pre-cleaning unit 240 and pre-cleaned in the pre-cleaning unit 240 (pre-cleaning step). The substrate W after completion of the pre-cleaning is transferred by the third substrate transfer robot 310 to the first pre-processing unit 320. The substrate W, which has transferred to the first pre-processing unit 320, is subjected to the first pre-processing and cleaning (first pre-processing step).

The substrate W after completion of the first pre-processing is transferred by the third substrate transfer robot 310 to the second pre-processing unit 340, and the second pre-processing and cleaning of the substrate W is carried out (second pre-processing step). The substrate W after completion of the second pre-processing is transferred by the third transfer robot 310 to the plating unit 360 to carryout plating and cleaning of the substrate W. The substrate W after completion of the plating is transferred by the third substrate transfer robot 310 to the second reversing machine 250 where the substrate W is reversed, and the substrate W is then transferred by the second substrate transfer robot 230 to the first cleaning section 270 of the cleaning unit 260. After cleaning, the substrate W is transferred by the second substrate transfer robot 230 to the second cleaning/drying section 290, where the substrate W is cleaned and dried.

The substrate W after completion of the cleaning and drying is transferred by the second substrate transfer robot 230 to the temporary substrate storage stage 210 and placed on the stage 210 for temporary storage. Thereafter, the substrate W is transferred by the first substrate transfer robot 130 to a substrate cassette mounted in the loading port 110 and placed in the substrate cassette.

It is of course that the substrate processing system adapted to the substrate processing apparatus according to the present invention is not limited to the substrate processing system of the above-described construction.

Though in this embodiment dip processing of a substrate W in the processing liquid Q is carried out while the surface (surface to be processed) of the substrate W held in the substrate holding apparatus 80 is kept tilted, it is also possible to dip a substrate W in a tilted position into the processing liquid Q and then return the substrate W to the horizontal position. Thus, in the substrate processing apparatus 1 shown in FIGS. 2A and 2B, the substrate holding apparatus 80 holding an unprocessed substrate W is tilted at a predetermined angle relative to the horizontal position by the tilting mechanism 811. Next, while rotating the substrate holding apparatus 80 and the substrate W by the rotating motor 400, the substrate holding apparatus 80 in the tilted position is lowered by the lifting mechanism 831 to dip the surface to be processed of the substrate W into the processing liquid Q in the processing tank 10. Next, the substrate holding apparatus 80 and the substrate W are returned to the horizontal position by the tilting mechanism 811, and dip processing of the surface to be processed of the substrate W is carried out while the substrate W is kept horizontally. After completion of the dip processing, the lifting mechanism 831 is driven to raise the substrate holding apparatus 80 to the position shown in FIGS. 2A and 2B, thereby terminating the dip processing. The drive mechanism 70 is then driven to pivot the cover 40 so as to close the opening 11 of the processing tank 10. The subsequent cleaning step is the same as described above, and hence a description thereof is omitted.

According to the present invention, when immersing the substrate, held by the substrate holding apparatus, in a processing liquid to carry out processing of the substrate while keeping the front surface (surface to be processed) of the substrate in contact with the processing liquid, the flow of the processing liquid can be closed off with the second sealing member, thereby preventing the processing liquid from intruding into the back surface side of the substrate. This makes it possible to ensure a sufficient immersion depth of the substrate, held by the substrate holding apparatus, in the processing liquid, thereby enhancing the quality of processing. Further, the provision of the second sealing member in the substrate pressing section, i.e. on the substrate pressing side of the apparatus, enables downsizing not only of the substrate holding apparatus itself but also of a robot hand for carrying a substrate in the substrate holding apparatus.

Figure 10:
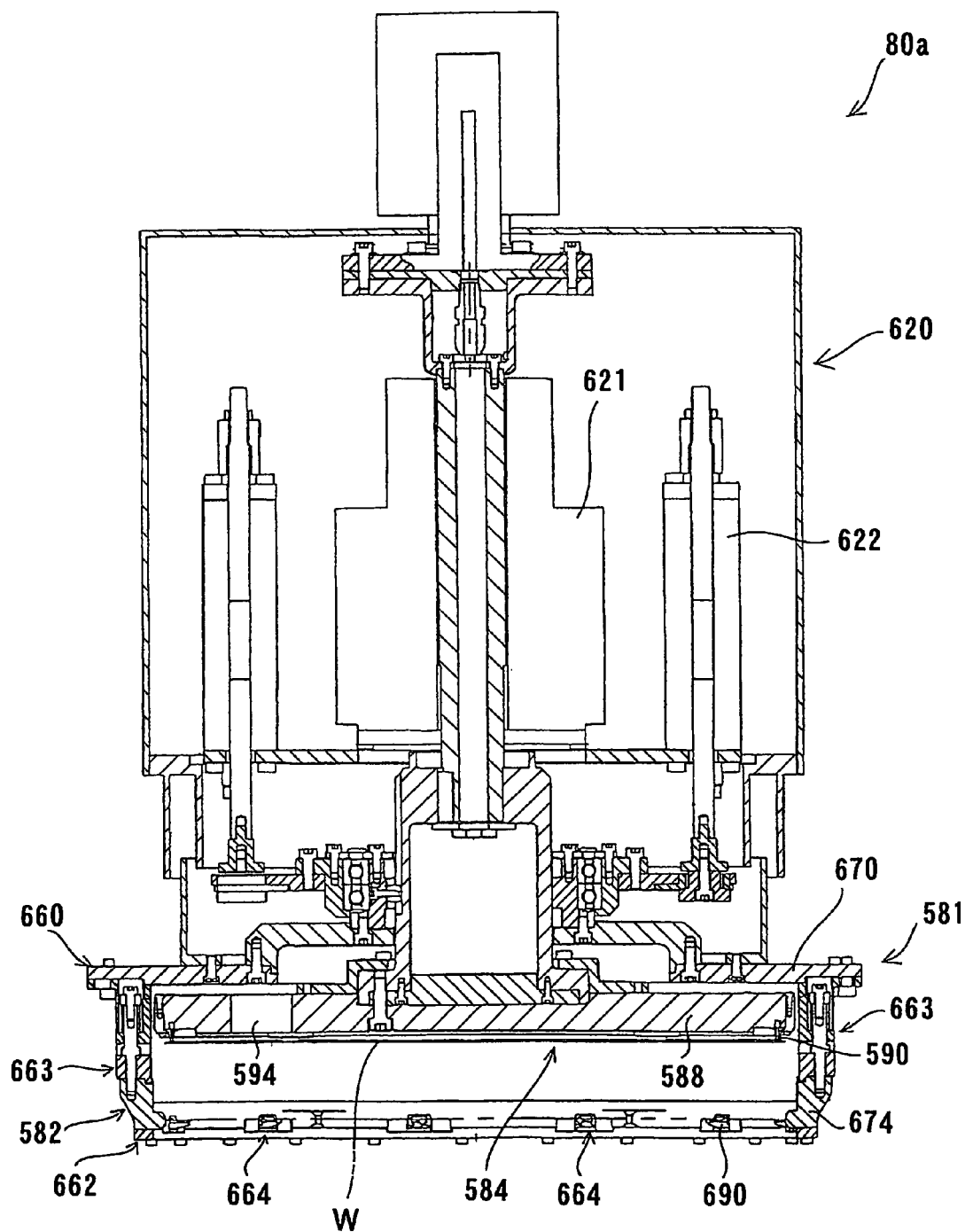
FIG. 10 is a vertical sectional front view of a substrate holding apparatus according to another embodiment of the present invention.

FIG. 10 is a schematic cross-sectional view showing a substrate holding apparatus according to another embodiment of the present invention. As shown in FIG. 10, the substrate holding apparatus 80a includes a substrate head 581 and a substrate head drive section 620. The substrate head 581 is comprised of a downwardly-open, generally cylindrical substrate holding section 582, and a generally circular attraction head 584 housed in the substrate holding section 582. The substrate head drive section 620 includes in its interior a substrate rotating motor 621 for rotationally driving the attraction head 584, and a substrate holding section driving cylinder 622 for moving up and down the substrate holding section 582 to predetermined positions (at least three positions). The attraction head 584 is rotationally driven by the substrate rotating motor 621, and the substrate holding section 582 is moved vertically by the substrate holding section drive cylinder 622. Thus, the attraction head 584 is rotatable but not vertically movable, while the substrate holding section 582 rotates together with the attraction head 584 and moves vertically.

Figure 11:
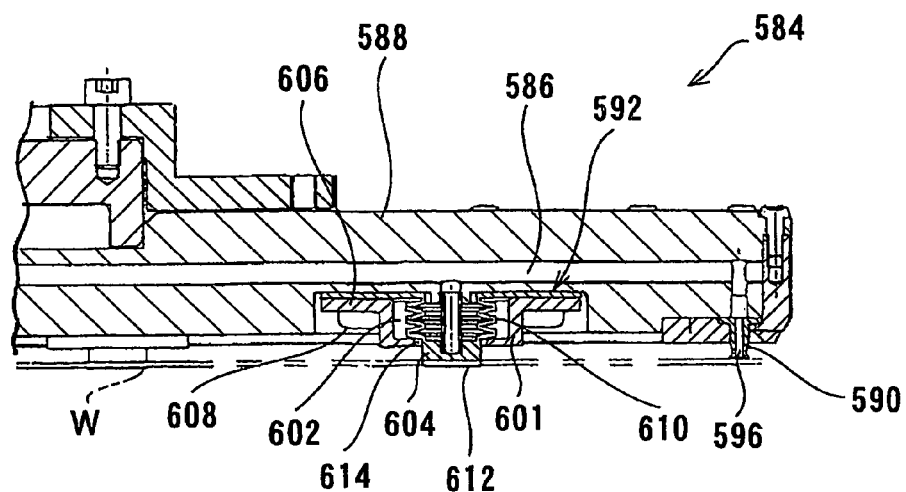
FIG. 11 is an enlarged cross-sectional view of the main portion of an attraction head of the substrate holding apparatus shown in FIG. 10.

FIG. 11 is an enlarged cross-sectional view of the main portion of the attraction head 584. As shown in FIGS. 10 and 11, the attraction head 584 comprises a generally circular support 588 having in its interior a vacuum supply line (vacuum/gas supply line) 586, a ring-shaped substrate attraction seal 590 mounted to the lower surface of the support 588, and a plurality of pushers 592 mounted inside the ring-shaped substrate attraction seal 590. Air vent portions 594 (see FIG. 10) comprised of openings, which penetrate up and down, are provided in the support 588.

The attraction seal 590 is formed of an elastic body such as a rubber. With the lower end protruding downwardly from the lower surface of the support 588, the attraction seal 590 attracts the periphery portion of the back surface of the substrate W in contact with a ring-shaped attraction portion and holds the substrate W, and also functions as a seal for preventing intrusion of the plating solution into the back surface (inside of the ring-shaped vacuum-attracted portion of the back surface) of the substrate W. The attraction seal 590 has, in the portion to be in contact with the substrate W, a substrate attraction groove (slit for attraction and release of substrate) 596. The substrate attraction groove 596 is connected to the vacuum supply line 586 so that the substrate W is attracted to and released from the substrate attraction groove 596. The attraction seal 590 is not limited to the shape shown in the Figures, but may be of any shape insofar as it can attract a substrate with a ring-shaped attraction portion of certain width.

Each pusher 592 is comprised of a pusher body (pressing pin) 604 housed in a housing portion 602 provided in the inside of an upwardly-open cylindrical box-shaped case 601, and a flange portion 606, overhanging from the periphery of the case 601, fixed to the support 588 by a bolt 608. The pusher body (pressing pin) 604 is formed of a flexible elastic material (fluororesin, synthetic rubber, etc.), and has a pressing portion 612 at the end of a bellows-shaped circumferential wall 610. The pressing portion 612 is retractably inserted in a through-hole 614 provided in the case 601. The lower surface of the pressing portion 612 is positioned slightly above the lower surface of the attraction seal 590. The back surface side of the pusher body 604 is connected to the vacuum supply line 586.

When a vacuum pressure is supplied to the vacuum supply line 586, the interior of the pusher body 604 becomes a vacuum state and the circumferential wall 610 of the pusher body 604 shrinks, whereby the pressing portion 612 retracts into the case 601. When a gas is supplied to the vacuum supply line 586, on the other hand, the circumferential wall 610 of the pusher body 604 extends and the pressing portion 612 protrudes out of the case 601.

Figure 12:
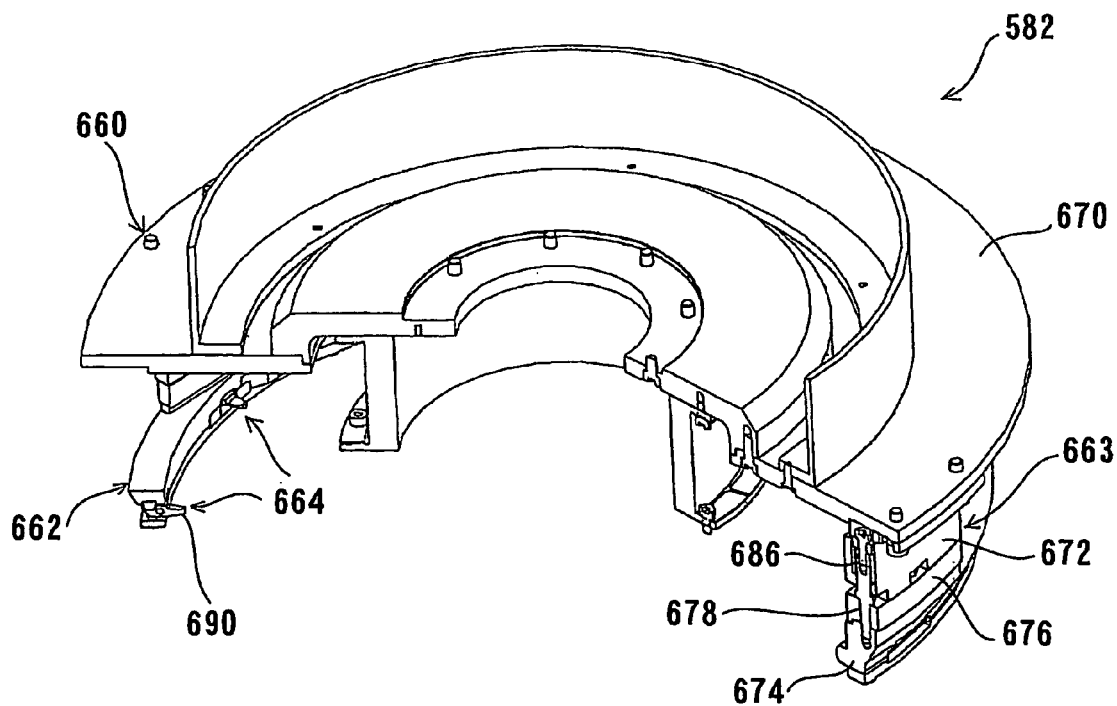
FIG. 12 is a perspective view, partially broken away, of a substrate holding section of the substrate holding apparatus shown in FIG. 10.

FIG. 12 is a perspective view, partially broken away, showing the substrate holding section 582. As shown in FIGS. 10 and 12, the substrate holding section 582 is comprised of a base section 660 coupled to the substrate holding section driving cylinder 622, a ring-shaped substrate support section 662 disposed at a given distance from the base section 660, and a pair of coupling sections 663 coupling the base section 660 and the substrate support section 662 tiltably with respect to each other. A plurality of pressing mechanisms 664 (12 mechanisms are shown in the Figures), which contact a peripheral portion of the front surface of the substrate W to support the substrate W and, as the substrate holding section 582 rises, press the substrate W against the attraction head 584, are provided at a given pitch along the circumferential direction of the substrate support section 662.

Figure 13:
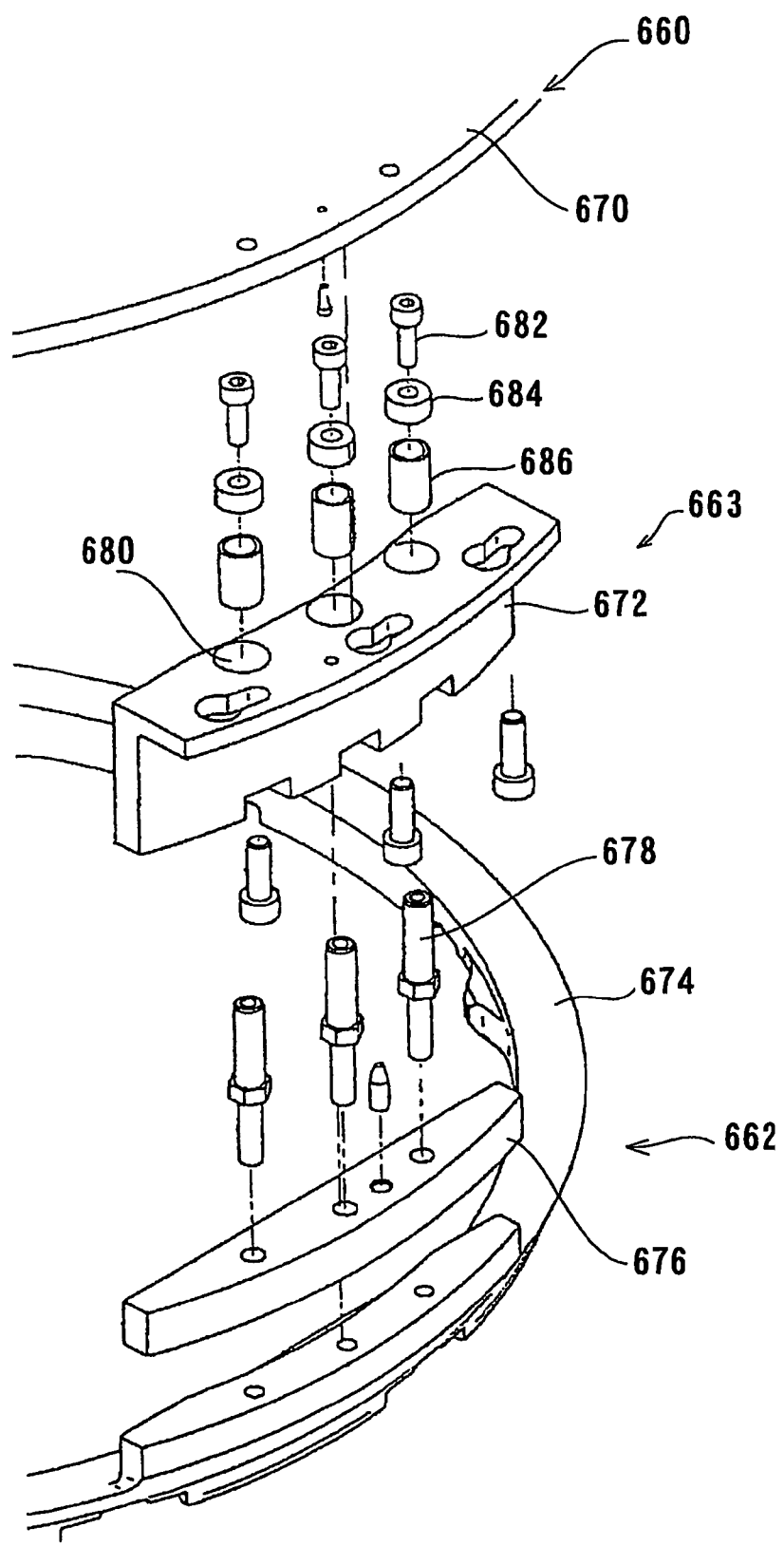
FIG. 13 is an exploded perspective view of a coupling section of the substrate holding section.

FIG. 13 is an exploded perspective view of the coupling section 663. As shown in FIGS. 12 and 13, the coupling section 663 includes a guide support 672 mounted to a peripheral portion of the lower surface of a peripheral plate 670 of the base section 660, and a guide spacer 676 mounted to the upper surface of a fixing ring 674 of the substrate support section 662. The lower portions of a plurality of guide bolts 678 (3 bolts are shown in FIG. 13) are inserted through the guide spacer 676 and screwed into the fixing ring 674 for fixing to the fixing ring 674, while the upper portions of the guide bolts 678 are positioned in housing portions 680 provided in the guide support 672.

In each housing portion 680 of the guide support 672 is housed an elastic body 686, comprised of a helical spring, whose lower surface is in contact with the bottom wall of the housing portion 680, and whose upper surface is in contact with the lower surface of a collar 684 which is mounted to the upper surface of the guide bolt 678 by a bolt 682. Thus, the substrate support section 662, at the opposite portions in the radial direction, is elastically coupled to the base section 660 through the elastic force of the elastic body (helical spring) 686 so that the substrate support section 662 can tilt with respect to the base section 660.

The substrate support section 662 is thus tiltable with respect to the base section 660. Accordingly, even when the back surface of the substrate W supported by the substrate support section 662 of the substrate holding section 582 is inclined with respect to the lower end surface of the attraction seal 590 of the attraction head 584, the substrate W can be tilted upon contact of the back surface of the substrate W with the lower end surface of the attraction seal 590 to correct the inclination, thereby preventing one-sided contact between the substrate W and the attraction seal 590. This makes it possible to securely bring a peripheral portion of the back surface of the substrate W into tight contact with the lower end surface of the attraction seal 590 over the entire circumference of the attraction seal 590 without creating an empty space therebetween.

Figure 15:
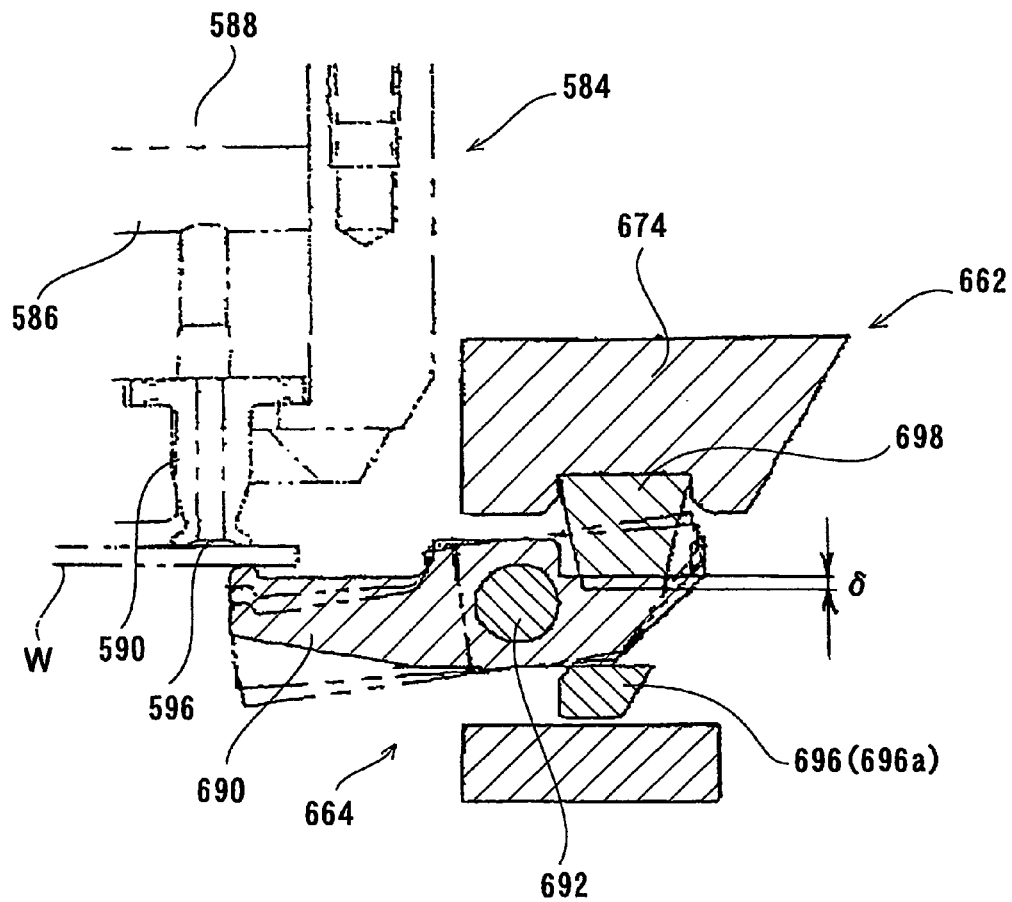
FIG. 15 is an enlarged sectional view showing the main portion of the pressing mechanism together with an attraction seal of an attraction head.

FIG. 14 is an exploded perspective view showing the pressing mechanism 664, and FIG. 15 is an enlarged sectional view showing the main portion of the pressing mechanism 664 together with the attraction seal 590 of the attraction head 584. As shown in FIGS. 12, 14 and 15, the pressing mechanism 664 includes a movable claw 690 disposed along the diametrical direction of the fixing ring 674 of the substrate support section 662 and projecting inwardly from the fixing ring 674 for contacting the front surface of the substrate W. Positioned approximately at the center in the length direction of the movable claw 690, a pivot shaft 692 is provided on either side of the movable claw 690. The pivot shaft 692 is pivotably supported by a cover 696 which is mounted by bolts 694 to the lower surface of the fixing ring 674, so that the movable claw 690 can pivot vertically.

Positioned on the outer side of the pivot shaft 692 of the movable claw 690, an elastic body 698 comprised of a truncated conical rubber is provided between the movable claw 690 and the fixing ring 674 and with a shrinkage δ, as shown in FIG. 15, whereby the movable claw 690 on the outer side of the pivot shaft 690 is biased downwardly by the elastic force of the elastic body (rubber) 698. Further, the bar-shaped portion 696a of the cover 696, positioned beneath the movable claw 690, functions as a stopper by contacting the lower surface of the movable claw 690 on the outer side of the pivot shaft 692 and thereby restricting the lowering of the movable claw 690.

In operation, as shown in FIG. 15, the front surface of the substrate W is brought into contact with the movable claw 690, on the inner side of the pivot shaft 692, of the substrate holding section 582 to thereby support the substrate W, and the substrate holding section 582 is then raised to bring a peripheral portion of the back surface of the substrate W into contact with the attraction seal 590 of the attraction head 584. When the substrate holding section 582 is further raised, the movable claw 690 pivots such that its inner side of the pivot shaft 692 lowers while its outer side rises (for convenience sake, FIG. 15 illustrates rotation of only the movable claw 690). When the movable claw 690 thus rotates, the elastic body (rubber) 698 disposed on the outer side of the pivot shaft 692 further shrinks and the elastic force of the elastic body 698 so acts on the inner side of the pivot shaft 692 as to raise the substrate W whereby the substrate W is pressed against the attraction seal 590 into tight contact with the attraction seal 590.

Thus, according to this embodiment, the substrate W is once supported by the movable claws 690 of the plurality of pressing mechanisms 664 provided in the substrate holding section 582, and the substrate W is pressed against the attraction seal 590 of the attraction head 584 independently at a plurality of portions along the circumferential direction of the substrate W by the plurality of pressing mechanisms 664. This makes it possible to securely bring a peripheral portion of the back surface of the substrate W into tight contact with the lower end surface of the attraction seal 590 over the entire circumference of the attraction seal 590 without creating an empty space therebetween. Further, by internally vacuuming the attraction seal 590, the substrate W can be securely attracted and held by the attraction seal 590. In particular, according to this embodiment, by raising the substrate holding section 582, a peripheral portion of the back surface of the substrate W can be securely brought into tight contact with the end surface of the attraction seal 590 over the entire circumference of the attraction seal 590 by the movable claws 690 and the elastic bodies 698.

Though in this embodiment the coupling sections 663 and the pressing mechanisms 664 are provided in the substrate holding section 582 to more securely bring a peripheral portion of the back surface of the substrate W into tight contact with the end surface of the attraction seal 590 over the entire circumference of the attraction seal 590 without creating an empty space therebetween, it is also possible to provide only one of the coupling sections 663 and the pressing mechanisms 664.

Figure 16:
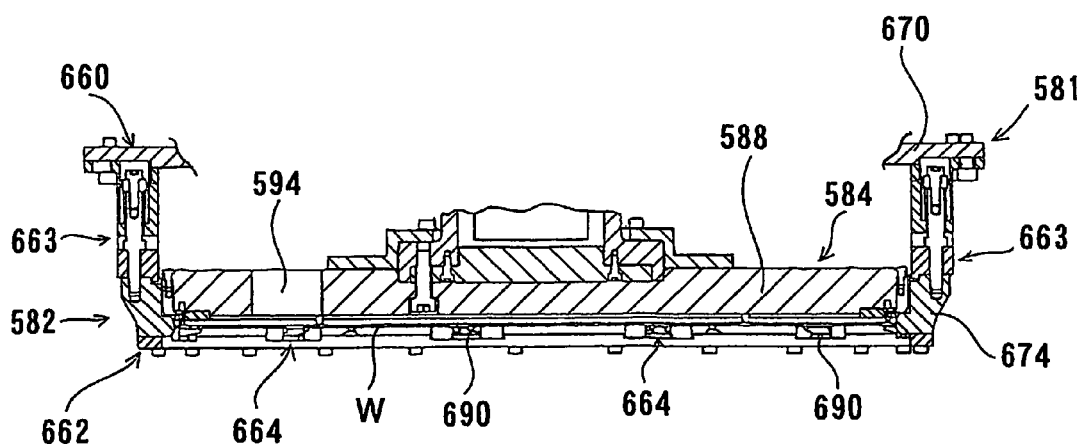
FIG. 16 is a view showing the main portion of the substrate holding apparatus, illustrating the state of the apparatus (in the substrate attraction position) when attracting and holding a substrate by the attraction seal.
Figure 17:
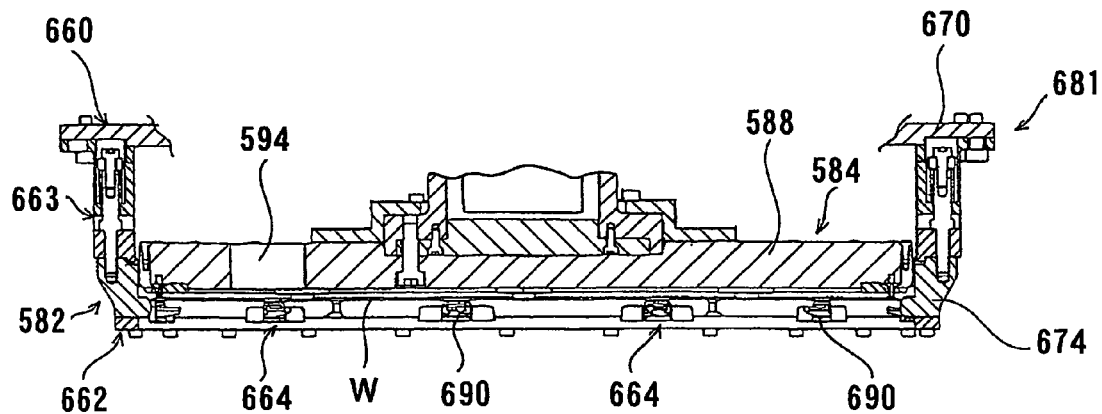
FIG. 17 is a view showing the main portion of the substrate holding apparatus, illustrating the state of the apparatus (in the substrate processing position) when lowering the substrate holding section after attracting and holding the substrate by the attraction seal.

The operation of the substrate holding apparatus 80a will now be described by referring also to FIGS. 16 and 17. FIG. 16 shows the main portion of the substrate holding apparatus 80a, illustrating the state of the apparatus (in the substrate attraction position) when attracting and holding a substrate W by the attraction seal 590, and FIG. 17 shows the main portion of the substrate holding apparatus 80a, illustrating the state of the apparatus (in the substrate processing position) when lowering the substrate holding section 582 after attracting and holding the substrate W by the attraction seal 590.

First, as shown in FIG. 10, the substrate holding section 582 is moved to the lowermost position (substrate transfer position) without rotating the attraction head 584, and a substrate W, which has been attracted and held by a robot hand (not shown), is inserted into the substrate head 581, and then the attraction of the robot hand is released to thereby place the substrate W on the movable claws 690 of the pressing mechanisms 664. The front surface of the substrate W on the movable claws 690 faces downward. Thereafter, the robot hand is withdrawn from the substrate head 581. Next, the substrate holding section 582 is raised so as to bring the lower end surface of the attraction seal 590 into contact with a peripheral portion of the back surface (upper surface) of the substrate W. If the back surface of the substrate W supported by the substrate support section 662 of the substrate holding section 582 has been inclined with respect to the lower end surface of the attraction seal 590 of the attraction head 584, the substrate W is tilted by the coupling sections 663 upon the contact to correct the inclination.

The substrate holding section 582 is further raised to pivot each movable claw 690 and cause the elastic body (rubber) 698, disposed on the outer side of the pivot shaft 692, to further shrink so that the elastic force of the elastic body 698 acts on the inner side of the pivot shaft 692 to raise the substrate W, thereby pressing the substrate W against the attraction seal 590 evenly at a plurality of portions of the substrate W into tight contact with the attraction seal 590.

The substrate attraction groove 596 is then vacuumed so as to attract the peripheral portion of the back surface of the substrate W to the attraction seal 590 to hold the substrate W. The vacuum force is generated only within the substrate attraction groove 596 inside that portion of the attraction seal 590 which is in contact with the substrate W. FIG. 16 shows the state of the apparatus upon the attraction and holding of the substrate W. The portion of the back surface of the substrate W, which is surrounded by the attraction seal 590, is shut off from the front surface (surface to be processed) of the substrate W by the sealing of the attraction seal 590.

According to this embodiment, a peripheral portion of the substrate W is sealed and attracted by the ring-shaped attraction seal 590 of small width (in the radial direction), thereby minimizing the attraction width and eliminating the adverse influence (such as bending) on the substrate W. In particular, the width of the attraction seal 590 is very small, and the contact portion of the substrate W with the attraction seal 590 lies, for example, within 5 mm of the peripheral end of the substrate W. Since only a peripheral portion of the back surface of the substrate W is in contact with the attraction seal 590 during processing, there is little fear of a lowering of the temperature of processing liquid due to heat transmission through the contact surface of the attraction seal 590 in contact with the substrate W.

Next, as shown in FIG. 17, the substrate holding section 582 is lowered slightly (e.g. several mm) to detach the substrate W from the movable claws 690. The whole substrate holding apparatus 80a is then lowered to immerse the substrate W into a not-shown processing liquid, such as a plating solution. Since only the back surface of the substrate W is attracted and held, the entire front surface as well as the edge portion of the substrate W can be immersed in the processing liquid to carry out processing thereof.

Further, since the substrate holding section 582 is lowered and is separated from the substrate W, and only the back surface of the substrate W is attracted and held, the flow of processing liquid is not impeded by the immersion of the substrate W and a uniform flow of processing liquid is created over the entire front surface of the substrate W. With the flow of processing liquid, gas bubbles caught on the front surface of the substrate W and gas bubbles generated during processing can be discharged from the front surface of the substrate W. Thus, a non-uniform flow of processing liquid that may adversely affect processing, such as plating, can be prevented and the influence of gas bubbles can be eliminated, thereby enabling uniform processing, such as plating, to be carried out over the entire front surface, including the edge, of the substrate W. Further, since the inside of the ring-shaped vacuum-attracted portion of the back surface of the substrate W is shut off from the front surface by the sealing of the attraction seal 590, the processing liquid can be prevented from intruding into the inside of the attraction seal 590 on the back surface of the substrate W.

During processing, each pressing portion 612 of the pusher body (pressing pin) 604 of the pusher 592 connected to the vacuum supply line 586 is, due to vacuuming, retracted in the case 601 and is apart from the back surface of the substrate W at a certain small distance. Accordingly, there is no fear of heat transfer between the processing liquid and the pressing portion 612 through contact therebetween during substrate processing.

With the provision of the air holes (air vent portions) 594 in the support 588 of the attraction head 584, the space above the back surface of the substrate W, defined by the support 588, the substrate W and the attraction seal 590, is not hermetically sealed. Accordingly, if a gas within the space expands or contracts by, for example, immersion of the substrate W in the processing liquid, there is no fear of bending of the substrate W due to the gas expansion or contraction.

After completion of the processing, such as plating, of the substrate W, the substrate holding section 582 is raised to the position (substrate attraction position) shown in FIG. 16 to place the substrates W on the movable claws 690. A gas (inert gas, e.g. nitrogen gas) is supplied to the vacuum supply line 586 to emit the gas from the substrate attraction groove 596 and, at the same time, pressurize each interior of the pusher body 604 of the pusher 592 so as to force the processing portion 612 of the pusher 592 to protrude from the case 601 and press on the back surface of the substrate W. At the same time, the substrate holding section 582 is lowered to detach the substrate W from the attraction seal 590, and is further lowered to the position (substrate transfer position) shown in FIG. 10. Thereafter, a robot hand is inserted into the substrate head 581 and the substrate W is drawn out by the robot hand.

By thus emitting a gas from the substrate attraction groove 596 and, at the same time, allowing the pressing portions 612 of the pushers 592 to press on the back surface of the substrate W, the substrate W can be detached from the attraction seal 590 easily and securely even when the attraction seal 590, due to a change in the quality with time, etc., is sticky to the substrate W and therefore the substrate W attracted to the attraction seal 590 is hard to detach from it only by the gas emission from the substrate attraction groove 596.

Figures 18A, 18B:
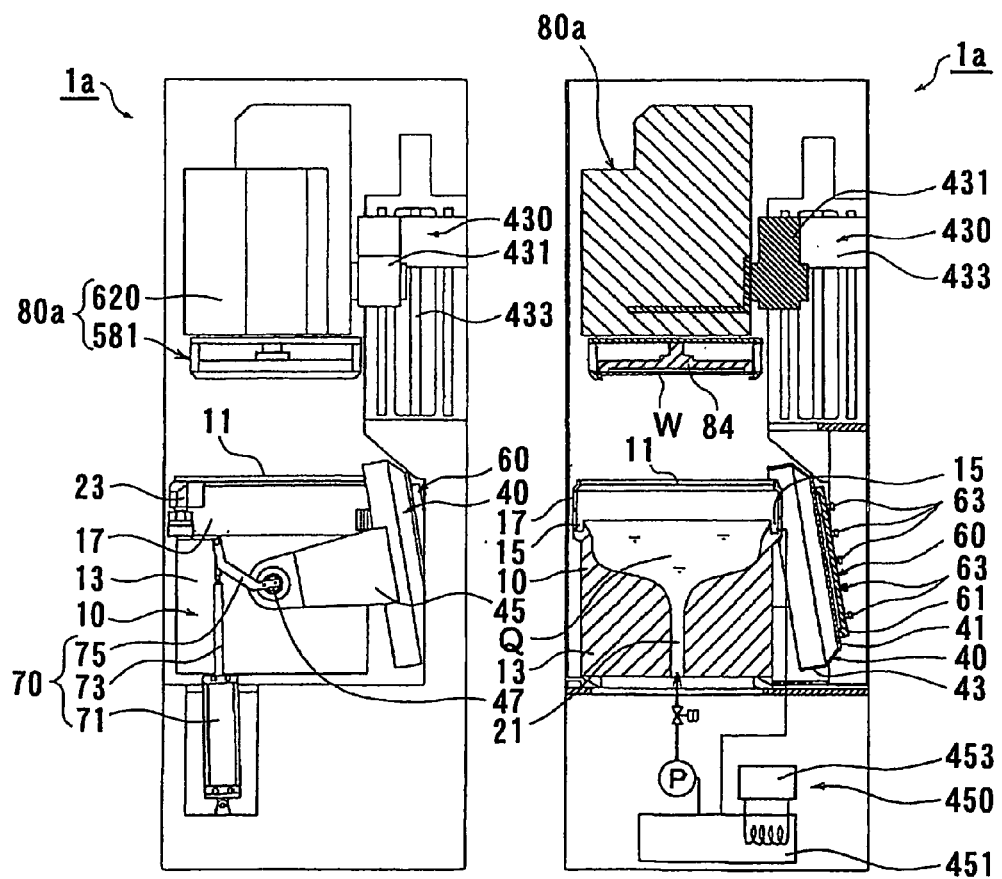
FIG. 18A is a side view of a substrate processing apparatus incorporating the substrate holding apparatus, showing the substrate processing apparatus before processing.
FIG. 18B is a schematic sectional side view of the substrate processing apparatus of FIG. 18A.

FIG. 18A is aside view of a substrate processing apparatus 1a including the substrate holding apparatus 80a of the above-described structure, and FIG. 18B is a schematic sectional side view of the substrate processing apparatus 1a. As shown in FIGS. 18A and 18B, the substrate processing apparatus 1a comprises a processing tank 10 for holding a plating solution Q and carrying out a dip processing of the substrate W, a cover 40 for closing the opening 11 of the processing tank 10, a spray nozzle 60 mounted to the upper surface of the cover 40, a drive mechanism 70 for driving (pivoting) the cover 40, a substrate holding apparatus 80a for holding a substrate W, a substrate holding apparatus drive mechanism 430 for driving the whole substrate holding apparatus 80a, and a processing liquid circulating device 450 for circulating a processing liquid Q in the processing tank 10.

The processing tank 10 includes a vessel-shaped processing tank body 13 for holding the processing liquid Q, a recovery groove 15 provided around the upper outer circumferential surface of the processing tank body 13 for recovering the processing solution Q overflowing the processing tank body 13, and a cover portion 17 surrounding the outside of the recovery groove 15 and projecting upwardly and cylindrically. A processing solution supply inlet 21 is provided at the center of the bottom of the processing tank body 13. To the cover portion 17 of the processing tank 10 is mounted a rinsing spray nozzle 23 for spraying a cleaning liquid (pure water) in a one-shot manner from the inner wall of the cover portion 17 toward the opening 11.

The processing liquid circulating device 450 returns the processing solution Q, which has overflowed into the recovery groove 15 of the processing tank 10, through a pipe to a supply tank 451, and supplies the plating solution Q which has been collected in the supply tank 451 to the processing solution supply inlet 21 of the processing tank body 13 by a pump P, thereby circulating the processing solution Q. The supply tank 451 is provided with a heater 453 for keeping the processing solution Q, to be supplied to the processing tank 10, at a predetermined temperature.

The cover 40 is comprised of a plate material of such a size as to close the opening 11 of the processing tank 10, and includes a generally circular upper plate portion 41 and a side plate portion 43 surrounding the outside of the upper plate portion 41. Plate-like arms 45 are mounted to the opposite side surfaces of the cover 40, and are rotatably supported at portions near the respective ends by bearing portions 47 provided on the substantially central side portions of the processing tank 10. The ends of the arms 45 are fixed to the ends of coupling arms 75 of the drive mechanism 70. The drive mechanism 70 comprises a cover pivoting cylinder 71, a rod 73 coupled to the piston of the cover pivoting cylinder 71, and the coupling arm 75 swingably coupled to the end of the rod 73. The lower end of the cover pivoting cylinder 71 is rotatably supported by a fixed member.

The spray nozzle 60 is comprised of a plurality (five) of nozzles 63 oriented upward and mounted in a line on a bar-shaped mounting block 61 which is mounted centrally on the upper surface of the cover 40. According to this embodiment, a cleaning liquid (pure water) is sprayed vertically upward from the nozzles 63.

The substrate holding apparatus drive mechanism 430 includes a swinging mechanism 431 for swinging the whole substrate holding apparatus 80a, and a pivoting/lifting mechanism 433 for pivoting and moving up and down the entirety of the substrate holding apparatus 80a and the pivoting mechanism 431.

The overall operation of the substrate processing apparatus 1a will now be described.

FIGS. 18A and 18B show the state of the apparatus 1a when the cover 40 has been pivoted to the retreat position to open the opening 11 of the processing tank 10, and the substrate holding apparatus 80a is in a raised position. At this moment, the processing liquid circulation apparatus 450 has been driven, and a processing liquid Q, such as a plating solution, is circulating between the processing tank 10 and the supply tank 451 while it is kept at a predetermined temperature. First, an unprocessed substrate W is attracted and held by the attraction head 584 of the substrate holding apparatus 80a in the above-described manner.

Figures 19A, 19B:
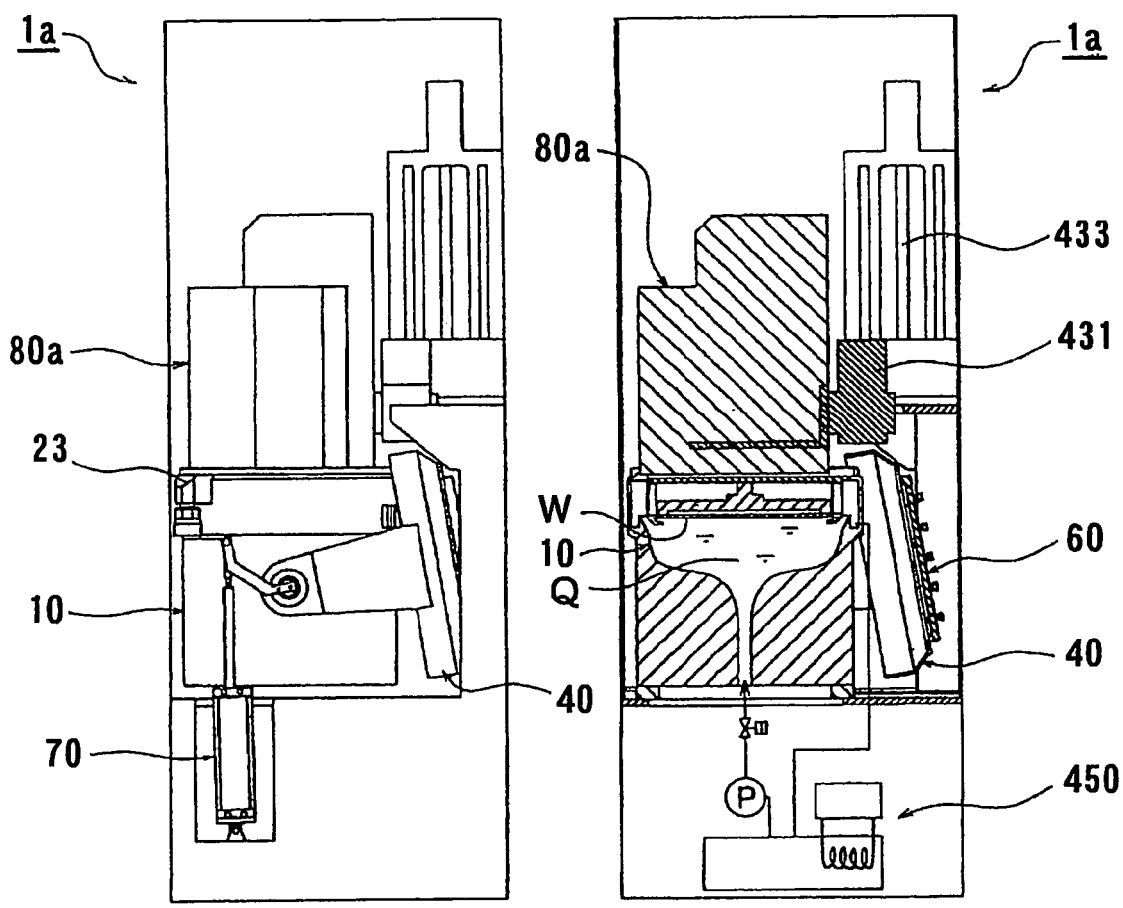
FIG. 19A is a side view of the substrate processing apparatus incorporating the substrate holding apparatus, showing the substrate processing apparatus upon processing of a substrate with a processing liquid.
FIG. 19B is a schematic sectional side view of the substrate processing apparatus of FIG. 19A.

Next, the whole substrate holding apparatus 80a is swung by the swinging mechanism 431 to tilt the substrate W at a predetermined angle from the horizontal position, and the pivoting/lifting mechanism 433 is then driven to lower the substrate holding apparatus 80a to the position shown in FIGS. 19A and 19B, thereby immersing the substrate W into the processing liquid Q. Thereafter, the whole substrate holding apparatus 80a is swung by the swinging mechanism 433 to the original position, thereby returning the substrate W to the horizontal position, and processing, such as electroless plating of the substrate W is carried out. During the processing, the substrate W is rotated by the actuation of the substrate rotating motor 621 shown in FIG. 10. According to the substrate processing apparatus 1a, the substrate W is tilted at a predetermined angle with respect to the horizontal position when it is immersed in the processing liquid Q. Accordingly, unlike the case of immersing the substrate W in the horizontal position into the processing liquid Q, gas bubbles such as air bubbles can be prevented from being caught and staying on the front surface (surface to be processed) of the substrate W.

Figure 20A:
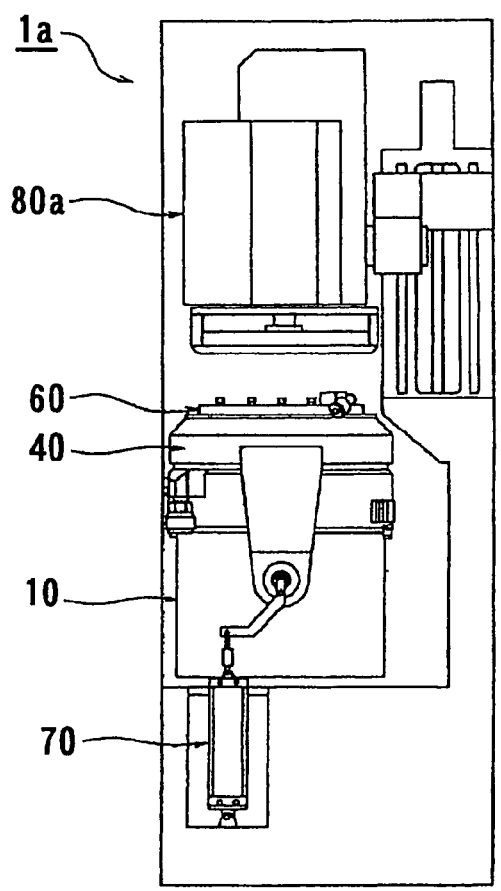
FIG. 20A is a side view of the substrate processing apparatus incorporating the substrate holding apparatus, showing the substrate processing apparatus upon cleaning of the substrate.
Figure 20B:
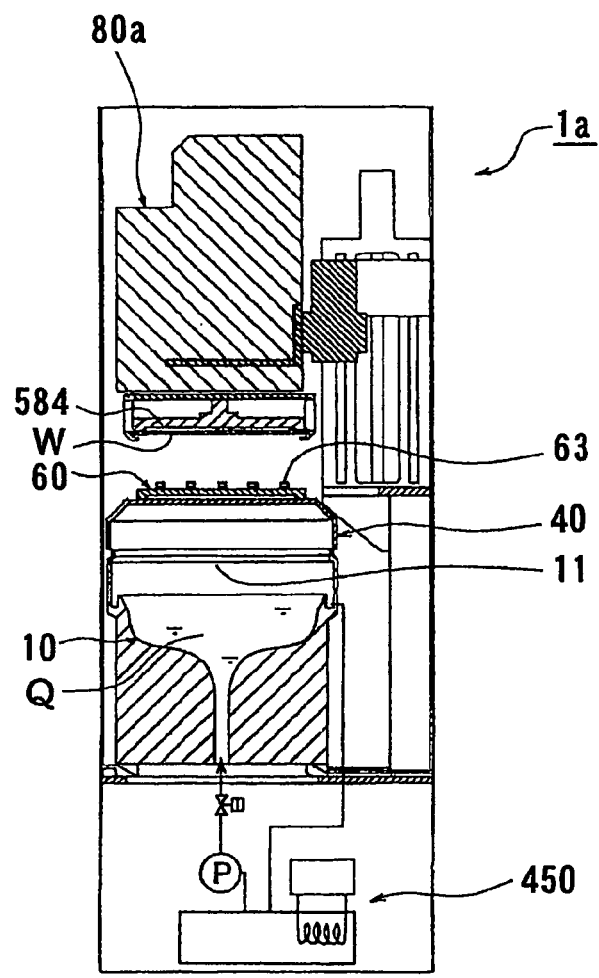
FIG. 20B is a schematic sectional side view of the substrate processing apparatus of FIG. 20A.

After carrying out the processing, such as electroless plating, of the front surface of the substrate W for a predetermined time, the pivoting/lifting mechanism 433 is driven to raise the substrate holding apparatus 80a to the position shown in FIGS. 20A and 20B. During the rise of the substrate W, a cleaning liquid (pure water) is jetted in a one-shot manner from the rinsing spray nozzle 23, provided in the processing tank 10, toward the processed surface of the rising substrate W. By thus cooling the substrate W immediately after the completion of electroless plating, progress of electroless plating by the processing liquid (plating solution) remaining on the substrate W is prevented.

Next, the drive mechanism 70 is driven to pivot the cover 40 to the closing position above the processing tank 10 at which it closes the opening 11 of the processing tank 10, thereby closing the opening 11 with the cover 40, as shown in FIGS. 20A and 20B. Next, a cleaning liquid is sprayed vertically upward from the nozzles 63 of the spray nozzle 60 fixed on the upper surface of the cover 40 to clean the processed surface of the substrate W. Since the opening 11 of the processing tank 10 is closed with the cover 40, the cleaning liquid does not enter the processing tank 10, that is, the processing liquid Q in the processing tank 10 is not diluted, enabling recycling of the processing liquid Q. The cleaning liquid after the cleaning of the substrate W is discharged from a not-shown discharge outlet. The substrate W after the cleaning is taken out of the substrate holding apparatus 80a in the above-described manner, while another unprocessed substrate W is set in the substrate holding apparatus 80a, and the substrate W is subjected to the above-described processing, such as plating, and cleaning.

Though in this embodiment electroless plating, for example, is carried out by using a plating solution as the processing liquid Q stored in the processing tank 10, it is also possible to carry out electroplating of the front surface (surface to be processed) of a substrate W by providing an anode within the processing tank 10 and connecting a cathode electrode to the substrate W. Further, it is possible to use the substrate processing apparatus 1*a* not as a plating apparatus but as a substrate processing apparatus for carrying out other chemical liquid processing (e.g. pre-plating or post-plating processing). Furthermore, processing of a substrate W carried out by the spray nozzle 60 is not limited to cleaning with a cleaning liquid, but other various chemical processings or treatments may be possible.

The substrate processing apparatus 1*a* can be used, for example, as the plating unit 360 shown in FIG. 9. The substrate processing apparatus 1*a* of this embodiment can also be used as the first pre-processing unit 320 or the second pre-processing unit 340 by using a pre-processing liquid as the processing liquid to be supplied into the processing tank 10.

The present invention makes it possible to securely bring a peripheral portion of the back surface of a substrate into tight contact with the end surface of an attraction seal over the entire circumference of the attraction seal without creating an empty space therebetween, thereby securely attracting and holding the substrate. Accordingly, by internally vacuuming the attraction seal, the substrate can be securely attracted and held by the attraction seal.

INDUSTRIAL APPLICABILITY

The present invention can be advantageously used for processing the surface (surface to be processed) of a substrate with a plating solution or other processing liquid.

The invention claimed is:

1. A substrate holding apparatus comprising:
    a substrate holding section for supporting a substrate with a front surface of the substrate facing downward; and
    an attraction head provided with an attraction seal for attracting and holding the substrate supported by the substrate holding section while sealing a peripheral portion of a back surface of the substrate in a ring;
    wherein the substrate holding section includes a plurality of pressing mechanisms disposed at locations along a circumferential direction of the substrate holding section, the pressing mechanisms being configured to contact a peripheral portion of the front surface of the substrate supported by the substrate holding section and to press the substrate against the attraction head, each of the pressing mechanisms including a movable claw arranged so that, as the substrate holding section moves relatively and closer to the attraction head, the moving claw comes into contact with the peripheral portion of the front surface of the substrate and presses the substrate against the attraction head; and
    wherein the movable claw is supported by a pivot shaft so as to be vertically pivotable and disposed along the diametrical direction of the substrate holding section, the movable claw being biased downwardly by an elastic body on the outer side of the pivot shaft, and being arranged to make contact with a peripheral portion of the front surface of the substrate on an inner side of the pivot shaft.

2. The substrate holding apparatus according to claim 1, wherein the elastic body comprises a generally truncated conical rubber member.

* * * * *